United States Patent
Hung et al.

(10) Patent No.: US 10,804,444 B2
(45) Date of Patent: Oct. 13, 2020

(54) LIGHT-EMITTING DEVICE AND MANUFACTURING METHOD THEREOF

(71) Applicant: Genesis Photonics Inc., Tainan (TW)

(72) Inventors: Cheng-Wei Hung, Tainan (TW); Long-Chi Tu, Tainan (TW); Jui-Fu Chang, Tainan (TW); Chun-Ming Tseng, Tainan (TW); Yun-Chu Chen, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 16/595,414

(22) Filed: Oct. 7, 2019

(65) Prior Publication Data

US 2020/0035875 A1    Jan. 30, 2020

Related U.S. Application Data

(60) Division of application No. 15/788,757, filed on Oct. 19, 2017, now Pat. No. 10,439,111, which is a
(Continued)

(30) Foreign Application Priority Data

May 14, 2014  (TW) .............................. 103116987 A
Jan. 8, 2016  (TW) .............................. 105100499 A
May 5, 2016  (CN) .......................... 2016 1 0293182

(51) Int. Cl.
*H01L 33/50* (2010.01)
*H01L 33/48* (2010.01)
(Continued)

(52) U.S. Cl.
CPC .......... *H01L 33/505* (2013.01); *H01L 33/486* (2013.01); *H01L 33/508* (2013.01);
(Continued)

(58) Field of Classification Search
None
See application file for complete search history.

(56) References Cited

U.S. PATENT DOCUMENTS 8,860,061 B2   10/2014  Kotani
9,029,893 B2*  5/2015  Akimoto ................. H01L 33/46
                                                                257/91
(Continued)

FOREIGN PATENT DOCUMENTS

CN           1674316         9/2005
CN         101515621         8/2009
(Continued)

OTHER PUBLICATIONS

"Office Action of China Related Application, application No. 201910110303.1", dated Dec. 25, 2019, p. 1-p. 11.
(Continued)

*Primary Examiner* — Mounir S Amer
(74) *Attorney, Agent, or Firm* — JCIPRNET

(57) ABSTRACT

A light-emitting device including at least one light-emitting unit, a wavelength conversion adhesive layer, and a reflective protecting element is provided. The light-emitting unit has an upper surface and a lower surface opposite to each other. The light-emitting unit includes two electrode pads, and the two electrode pads are located on the lower surface. The wavelength conversion adhesive layer is disposed on the upper surface. The wavelength conversion adhesive layer includes a low-concentration fluorescent layer and a high-concentration fluorescent layer. The high-concentration fluorescent layer is located between the low-concentration fluorescent layer and the light-emitting unit. The width of the high-concentration fluorescent layer is $W_H$. The width of the low-concentration fluorescent layer is $W_L$. The width of the light-emitting unit is $W_E$. The light-emitting device further satisfies the following inequalities: $W_E<W_L$,
(Continued)

$W_H < W_L$ and $0.8 < W_H/W_E \leq 1.2$. Furthermore, a manufacturing method of the light-emitting device is also provided.

20 Claims, 30 Drawing Sheets

Related U.S. Application Data continuation-in-part of application No. 15/268,654, filed on Sep. 19, 2016, now Pat. No. 9,997,676, which is a continuation-in-part of application No. 14/711,798, filed on May 14, 2015, now abandoned.

(60) Provisional application No. 62/157,450, filed on May 5, 2015, provisional application No. 62/220,249, filed on Sep. 18, 2015, provisional application No. 62/236,150, filed on Oct. 2, 2015, provisional application No. 62/245,247, filed on Oct. 22, 2015, provisional application No. 62/262,876, filed on Dec. 3, 2015, provisional application No. 62/410,373, filed on Oct. 19, 2016.

(51) Int. Cl.
*H01L 33/56* (2010.01)
*H01L 33/62* (2010.01)
*H01L 33/60* (2010.01)
*H01L 33/54* (2010.01)

(52) U.S. Cl.
CPC .............. *H01L 33/56* (2013.01); *H01L 33/60* (2013.01); *H01L 33/62* (2013.01); *H01L 33/54* (2013.01); *H01L 2224/18* (2013.01); *H01L 2933/005* (2013.01); *H01L 2933/0041* (2013.01); *H01L 2933/0058* (2013.01); *H01L 2933/0091* (2013.01)

(56) References Cited

U.S. PATENT DOCUMENTS

| | | | |
|---|---|---|---|
| 2004/0119402 | A1 | 6/2004 | Shiang et al. |
| 2004/0239242 | A1 | 12/2004 | Mano et al. |
| 2006/0055309 | A1 | 3/2006 | Ono et al. |
| 2006/0169994 | A1 | 8/2006 | Tu et al. |
| 2007/0114552 | A1 | 5/2007 | Jang et al. |
| 2010/0117530 | A1 | 5/2010 | Lin et al. |
| 2011/0018017 | A1 | 1/2011 | Bierhuizen et al. |
| 2011/0297980 | A1* | 12/2011 | Sugizaki ................ H01L 33/38 257/98 |
| 2012/0025218 | A1 | 2/2012 | Ito et al. |
| 2012/0223351 | A1 | 9/2012 | Margalit |
| 2012/0236582 | A1 | 9/2012 | Waragaya et al. |
| 2013/0285091 | A1 | 10/2013 | Akimoto et al. |
| 2014/0054621 | A1 | 2/2014 | Seko |
| 2014/0138725 | A1 | 5/2014 | Oyamada |
| 2015/0188004 | A1 | 7/2015 | Ozeki et al. |
| 2016/0181476 | A1* | 6/2016 | Chang .................... H01L 33/20 257/13 |

FOREIGN PATENT DOCUMENTS

| | | |
|---|---|---|
| CN | 201910421 | 7/2011 |
| CN | 102290500 | 12/2011 |
| CN | 102315354 | 1/2012 |
| CN | 102651444 | 8/2012 |
| CN | 102800784 | 11/2012 |
| CN | 103199183 | 7/2013 |
| CN | 104521015 | 4/2015 |
| JP | 2012227470 | 11/2012 |
| JP | 5606342 | 10/2014 |
| TW | 201103173 | 1/2011 |
| TW | 201401565 | 1/2014 |
| TW | 201403873 | 1/2014 |
| TW | 201515273 | 4/2015 |

OTHER PUBLICATIONS

"Office Action of Taiwan Related Application, application No. 105107287", dated Jan. 17, 2020, pp. 1-7.

"Office Action of China Related Application, application No. 201610830051.6", dated Sep. 27, 2019, p. 1-p. 6.

"Office Action of Taiwan Related Application, application No. 105114037", dated Nov. 7, 2019, p. 1-p. 5.

Office Action of Taiwan Related Application No. 108118972, dated Dec. 25, 2019, pp. 1-9.

Office Action of U.S. Appl. No. 16/180,071, dated Jan. 8, 2020, pp. 1-28.

"Office Action of China Counterpart Application", dated Mar. 25, 2020, p1-p5.

"Office Action of Taiwan Related Application No. 105114037", dated Apr. 20, 2020, pp. 1-7.

"Office Action of U.S. Appl. No. 16/699,805", dated May 12, 2020, pp. 1-71.

"Office Action of China Related Application No. 201510244596.4", dated Jun. 2, 2020, pp. 1-6.

* cited by examiner

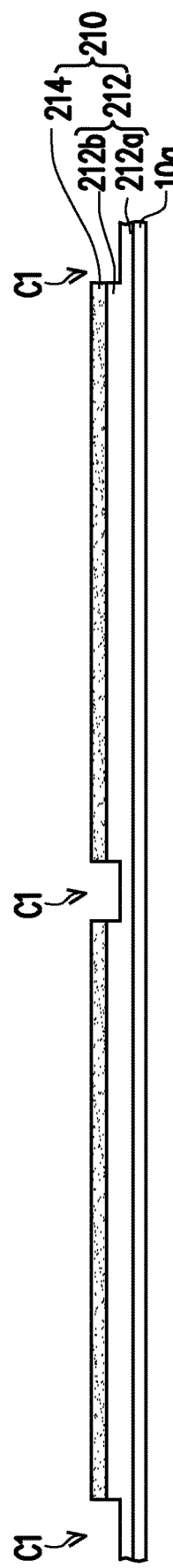
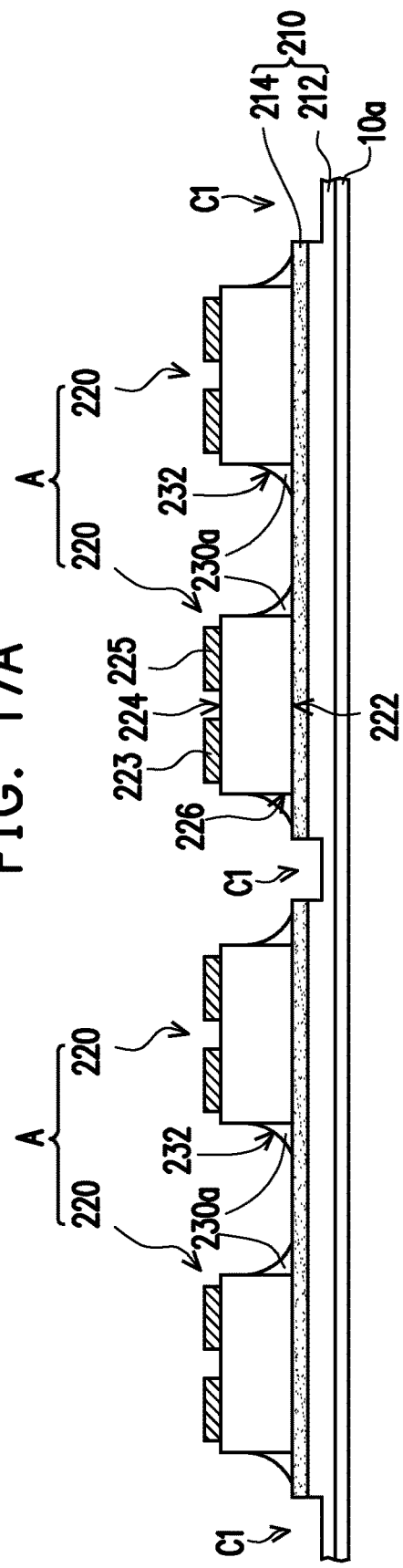
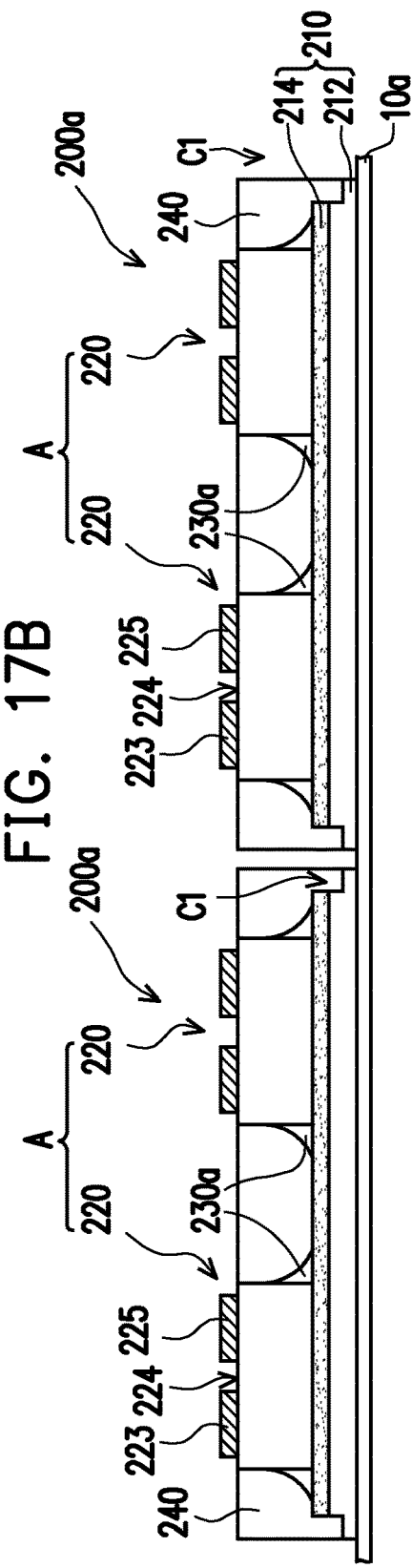
FIG. 17A
FIG. 17B
FIG. 17C

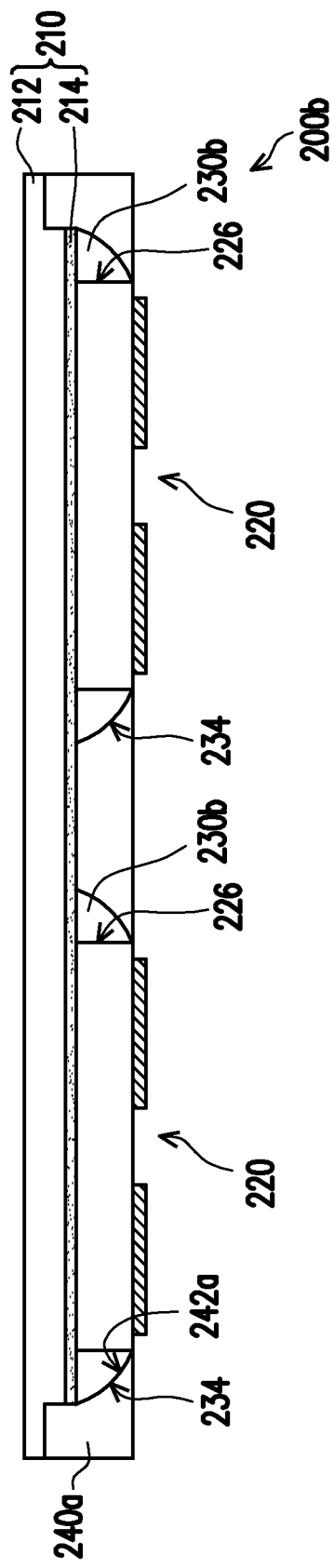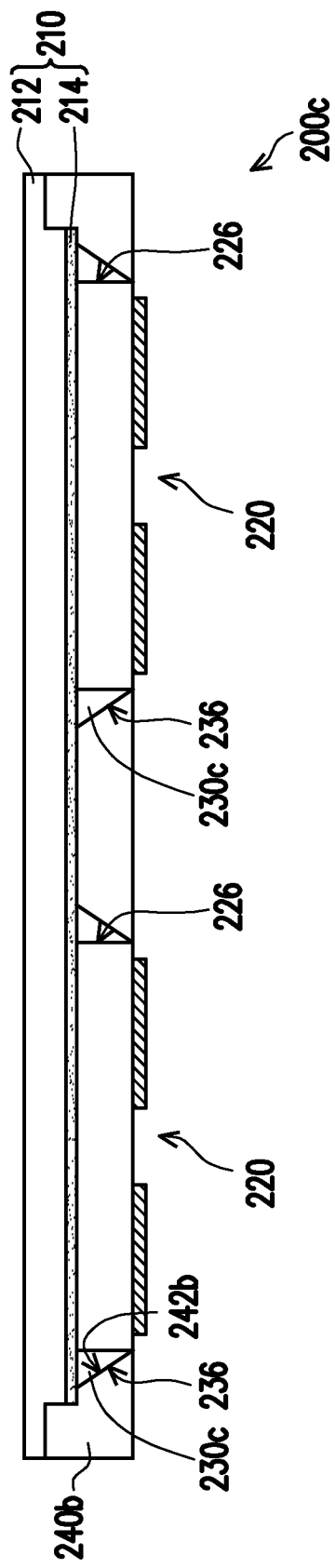

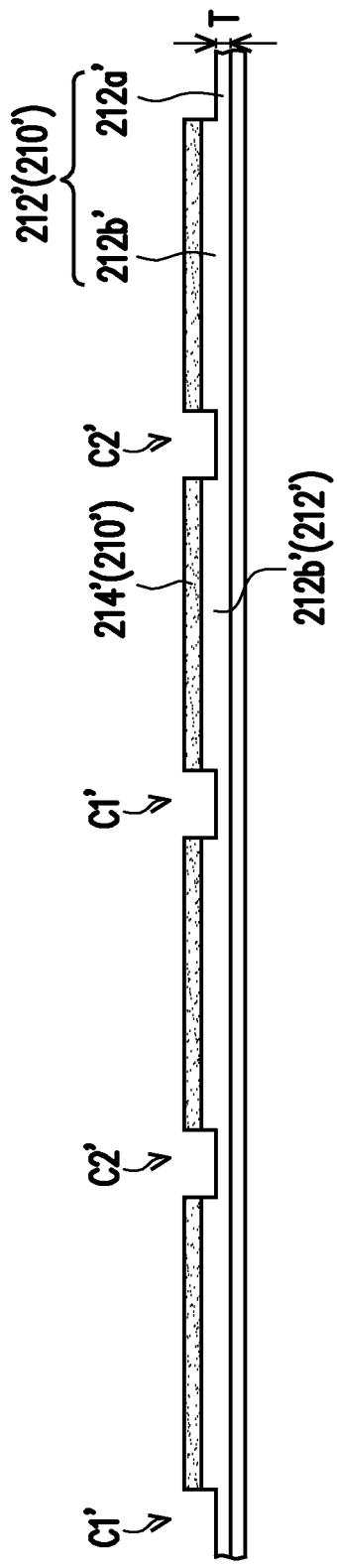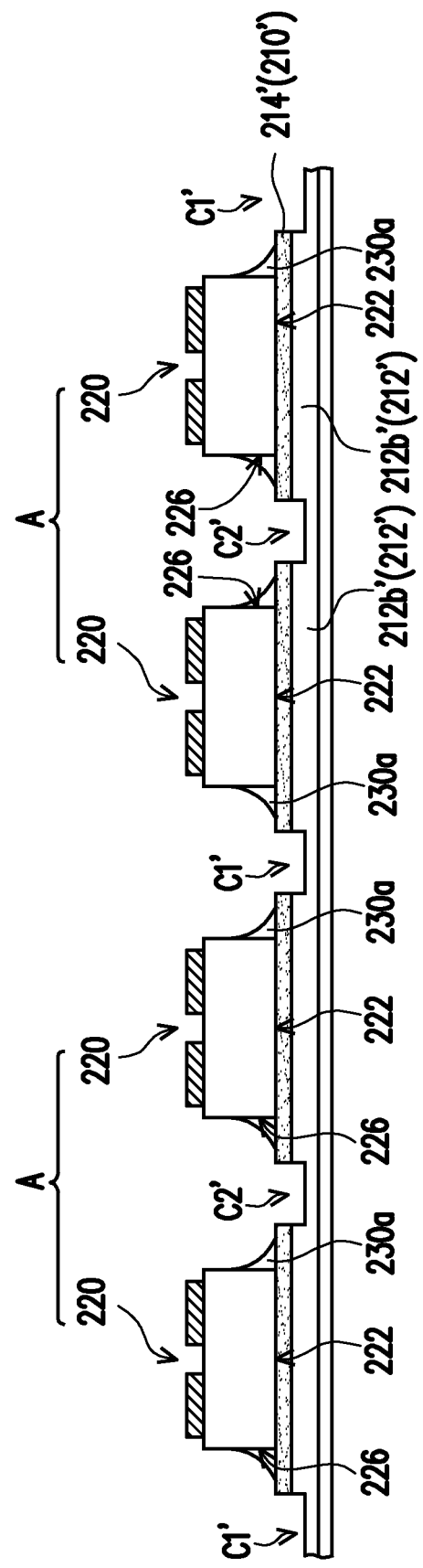

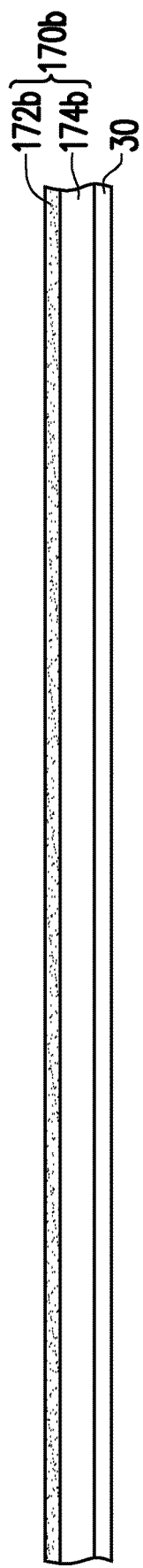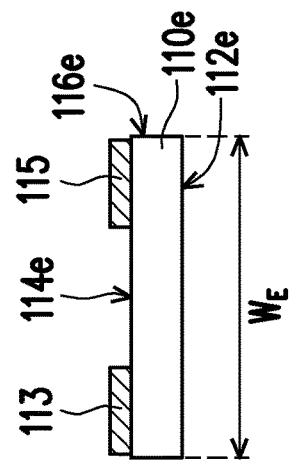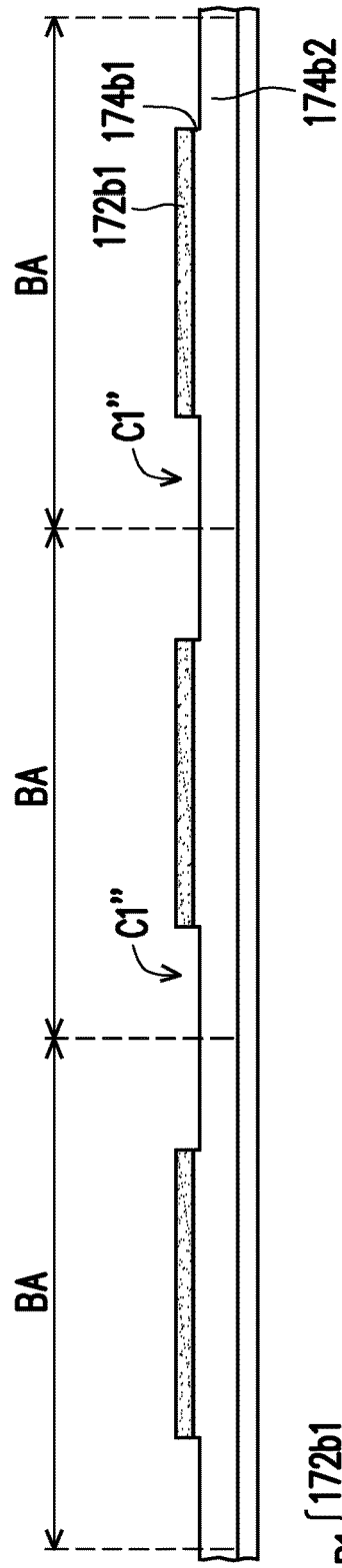
FIG. 22A  FIG. 22B  FIG. 22C

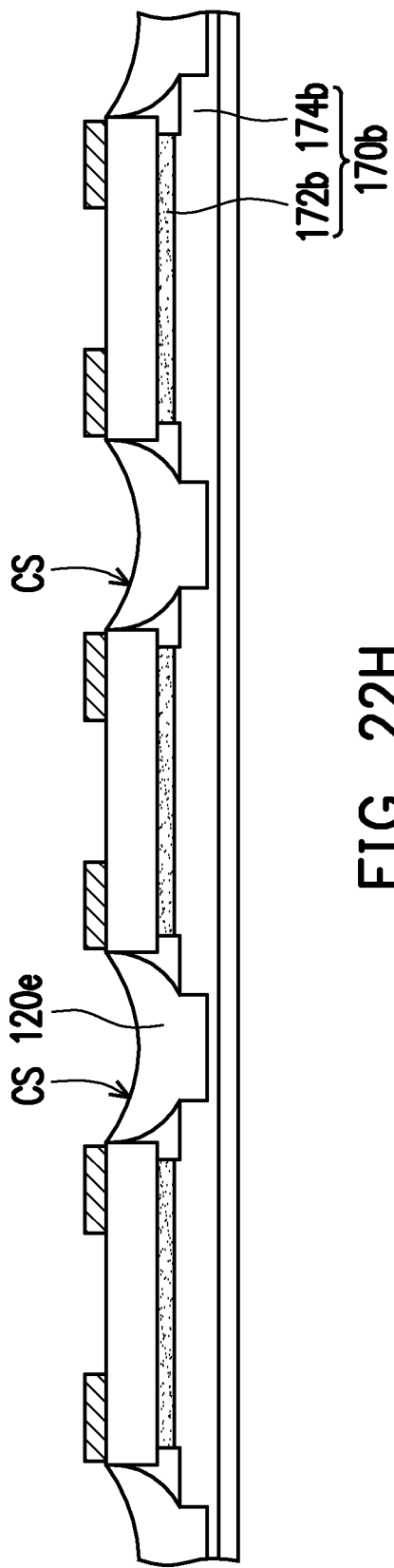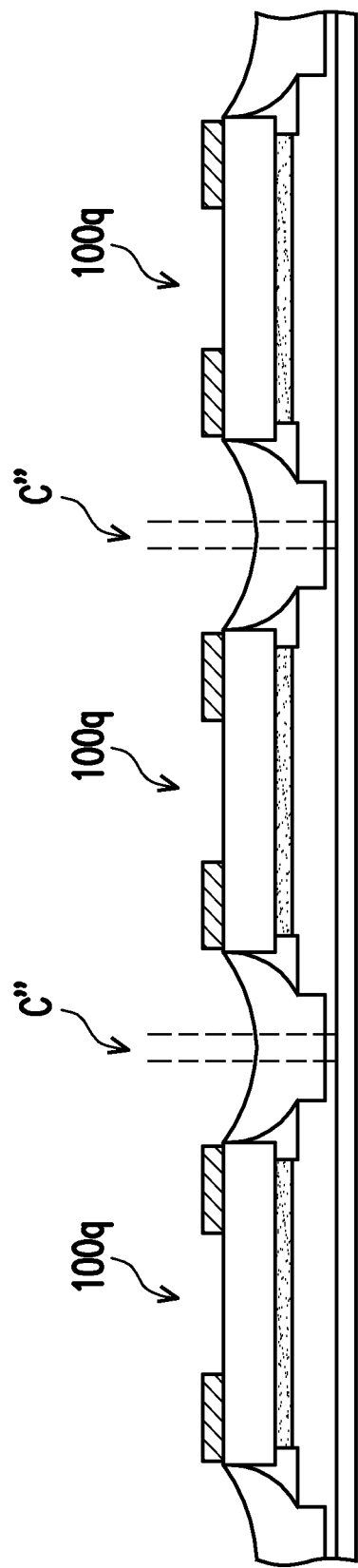

LIGHT-EMITTING DEVICE AND MANUFACTURING METHOD THEREOF

CROSS-REFERENCE TO RELATED APPLICATION

This application is a divisional application of and claims the priority benefit of U.S. application Ser. No. 15/788,757, filed on Oct. 19, 2017, now allowed. The prior U.S. application Ser. No. 15/788,757 is a continuation-in-part application of and claims the priority benefit of U.S. application Ser. No. 15/268,654, filed on Sep. 19, 2016, now patented. The prior U.S. application Ser. No. 15/788,757 also claims the priority benefit of U.S. provisional application Ser. No. 62/410,373, filed on Oct. 19, 2016. This prior U.S. application Ser. No. 15/268,654 is a continuation-in-part application of and claims the priority benefit of U.S. application Ser. No. 14/711,798, filed on May 14, 2015, now abandoned, which claims the priority benefits of Taiwan application serial no. 103116987, filed on May 14, 2014 and U.S. provisional application Ser. No. 62/157,450, filed on May 5, 2015. This prior U.S. application Ser. No. 15/268,654 also claims the priority benefits of U.S. provisional application Ser. No. 62/220,249, filed on Sep. 18, 2015, U.S. provisional application Ser. No. 62/236,150, filed on Oct. 2, 2015, Taiwan application serial no. 105100499, filed on Jan. 8, 2016, U.S. provisional application Ser. No. 62/245,247, filed on Oct. 22, 2015, U.S. provisional application Ser. No. 62/262,876, filed on Dec. 3, 2015, and China application serial no. 201610293182.5, filed on May 5, 2016. The entirety of each of the above-mentioned patent applications is hereby incorporated by reference herein and made a part of this specification.

BACKGROUND OF THE INVENTION

Field of the Invention

The invention relates to a light-emitting device and a manufacturing method thereof, and more particularly, to a light-emitting device for which an LED is used as the light source and a manufacturing method thereof.

Description of Related Art

In a regular white LED structure, a layer of yellow phosphor is covered on a blue LED chip. The mechanism with which the white LED structure emits white light includes emitting blue light via a blue LED chip, wherein a portion of the blue light passes through the yellow phosphor on top and is converted into yellow light, and the yellow light is combined with blue light from other portions to achieve the effect of white light emission. Since the blue light emitted by the blue LED chip has a higher degree of directivity, blue light deviated from the optical axis at a greater angle is weaker, and blue light closer to the optical axis is stronger. Therefore, when blue light is irradiated on fluorescent powder at different intensities, the color temperature of white light correspondingly emitted closer to the optical axis is higher (i.e., blue ratio is high) and the color temperature of white light correspondingly emitted farther from the optical axis is lower (i.e., blue light ratio is low). The phenomenon is also referred to as yellow circle phenomenon, and the color temperature of the light from the white LED structure is not uniform as a result.

SUMMARY OF THE INVENTION

The invention provides a light-emitting device having a uniform light color temperature.

The invention provides a manufacturing method of the light-emitting device. The color temperature of light emitted from the resulting light-emitting device is uniform.

An embodiment of the invention provides a light-emitting device including at least one light-emitting unit, a wavelength conversion adhesive layer, and a reflective protecting element. The light-emitting unit has an upper surface and a lower surface opposite to each other. The light-emitting unit includes two electrode pads, and the two electrode pads are located on the lower surface of the light-emitting unit. The wavelength conversion adhesive layer is disposed on the upper surface of the light-emitting unit. The wavelength conversion adhesive layer includes a low-concentration fluorescent adhesive layer and a high-concentration fluorescent adhesive layer, and the high-concentration fluorescent adhesive layer is located between the low-concentration fluorescent adhesive layer and the light-emitting unit. The reflective protecting element covers the light-emitting unit and a portion of the wavelength conversion adhesive layer and at least exposes the two electrode pads of the light-emitting unit and the low-concentration fluorescent layer. The width of the high-concentration fluorescent layer is $W_H$. The width of the low-concentration fluorescent layer is $W_L$. The width of the light-emitting unit is $W_E$. The light-emitting device further satisfies the following inequalities: $W_E<W_L$, $W_H<W_L$ and $0.8<W_H/W_E\leq 1.2$.

In an embodiment of the invention, the wavelength conversion adhesive layer further includes a first mesa portion and a plurality of second mesa portions. The first mesa portion includes the high-concentration fluorescent adhesive layer and a first portion of the low-concentration fluorescent adhesive layer, each of the second mesa portions includes a second portion of the low-concentration fluorescent adhesive layer, and the first portion of the low-concentration fluorescent adhesive layer is connected to the second portion of the low-concentration fluorescent adhesive layer.

In an embodiment of the invention, the reflective protecting element has a concave surface, and the concave surface is recessed toward the wavelength conversion adhesive layer.

In an embodiment of the invention, the light-emitting device further includes a translucent adhesive layer. The light-emitting unit further includes a side surface connected to the upper surface and the lower surface. The translucent adhesive layer is disposed on the low-concentration fluorescent adhesive layer and extended to the side surface of the light-emitting unit.

In an embodiment of the invention, the reflective protecting element covers the wavelength conversion adhesive layer and exposes a portion of the side of the wavelength conversion adhesive layer.

In an embodiment of the invention, the reflective protecting element has a reflective surface, and the reflective surface is in contact with the light-emitting unit.

In an embodiment of the invention, the first side of the reflective surface is in contact with the light-emitting unit, and the second side of the reflective surface is extended toward the wavelength conversion adhesive layer and away from the light-emitting unit.

In an embodiment of the invention, the reflective surface is a curved surface.

An embodiment of the invention provides a manufacturing method of a light-emitting device including forming a wavelength conversion adhesive layer, wherein the wavelength conversion adhesive layer includes a low-concentration fluorescent adhesive layer and a high-concentration fluorescent adhesive layer. A plurality of light-emitting units is provided. A plurality of trenches is formed in the wavelength conversion adhesive layer to define a plurality of bonding regions between the trenches. In the bonding regions, the width of the high-concentration fluorescent adhesive layer is $W_H$, the width of the low-concentration fluorescent adhesive layer is $W_L$, the width of the light-emitting unit is $W_E$, and the step further satisfies the following inequalities: $W_E<W_L$, $W_H<W_L$, and $0.8<W_H/W_E\leq1.2$. The light-emitting units are respectively bonded to the high-concentration fluorescent adhesive layers in the bonding regions. A reflective protecting element is formed on the wavelength conversion adhesive layer and between the light-emitting units to completely fill the trenches, wherein the reflective protecting element exposes the electrode pads of the light-emitting units. A cutting process is performed along the trenches to form a plurality of light-emitting devices.

In an embodiment of the invention, the step of forming the trenches in the wavelength conversion adhesive layer further includes removing a portion of the high-concentration fluorescent adhesive layer and a portion of the low-concentration fluorescent adhesive layer to form a plurality of first sub-trenches. The first sub-trenches respectively form a plurality of first mesa portions in the bonding regions, wherein each of the first mesa portions further includes a first portion of the high-concentration fluorescent adhesive layer and a first portion of the low-concentration fluorescent adhesive layer. A portion of the low-concentration fluorescent adhesive layer is removed to form a plurality of second sub-trenches in the first sub-trenches, and the second sub-trenches respectively form a plurality of second mesa portions in the bonding regions, wherein each of the second mesa portions further includes a second portion of the low-concentration fluorescent adhesive layer, and the first portion of the low-concentration fluorescent adhesive layer is connected to the second portion of the low-concentration fluorescent adhesive layer. A trench includes a first sub-trench and a second sub-trench.

In an embodiment of the invention, before the step of respectively bonding the light-emitting units to the high-concentration fluorescent adhesive layers in the bonding regions, a plurality of translucent adhesive layers is respectively formed on the high-concentration fluorescent adhesive layers in the bonding regions.

In an embodiment of the invention, in the step of respectively bonding the light-emitting units to the high-concentration fluorescent adhesive layers in the bonding regions, the light-emitting units are respectively bonded to the high-concentration fluorescent adhesive layers via the translucent adhesive layers.

In an embodiment of the invention, after the step of forming the reflective protecting element on the wavelength conversion adhesive layer and between the light-emitting units to completely fill the trenches, the reflective protecting element is left to stand to form a concave surface recessed toward the wavelength conversion adhesive layer in the reflective protecting element, and the reflective protecting element is cured.

Based on the above, in the light-emitting device of an embodiment of the invention, the width of the high-concentration fluorescent adhesive layer is $W_H$, the width of the low-concentration fluorescent adhesive layer is $W_L$, and the width of the light-emitting unit is $W_E$. The light-emitting device further satisfies the following inequalities: $W_E<W_L$, $W_H<W_L$ and $0.8<W_H/W_E\leq1.2$. By satisfying the inequality design above, the color temperature of the color light emitted by the light-emitting device of an embodiment of the invention is more consistent at different angles. Since one of the steps of the manufacturing method of the light-emitting device of an embodiment of the invention satisfies the above inequalities, the color temperature of the color light emitted by the light-emitting device made by the manufacturing method is more consistent at different angles.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 17A to FIG. 17E show cross sections of a manufacturing method of a light-emitting device of an embodiment of the invention.

FIG. 18A and FIG. 18B show cross sections of two light-emitting devices of two embodiments of the invention.

FIG. 19A to FIG. 19E show cross sections of a manufacturing method of a light-emitting device of another embodiment of the invention.

FIG. 22A to FIG. 22J show cross sections of a manufacturing method of a light-emitting device of another embodiment of the invention.

DESCRIPTION OF THE EMBODIMENTS

Figure 1:
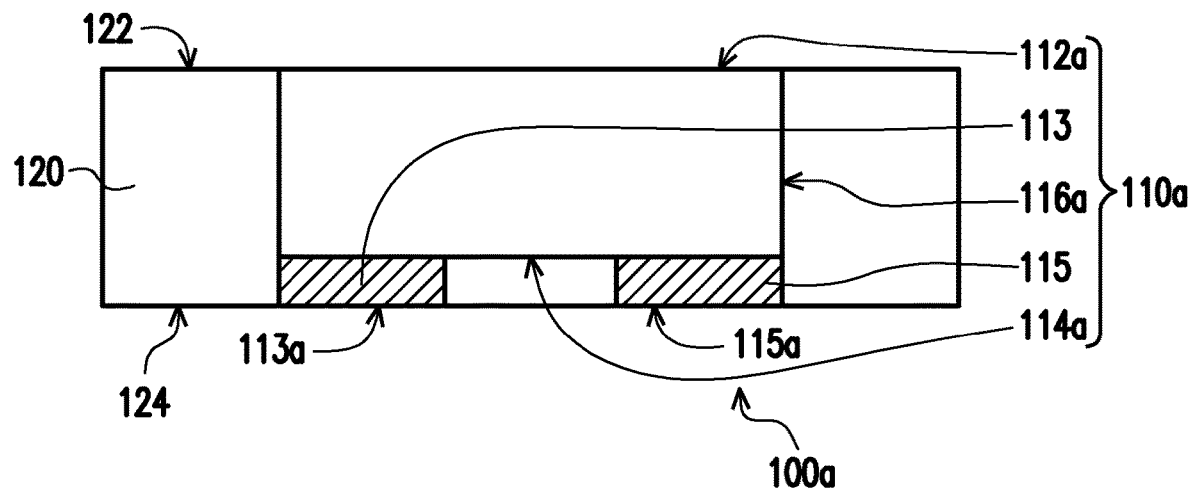
FIG. 1 shows a schematic of a light-emitting device of an embodiment of the invention.

FIG. 1 shows a schematic of a light-emitting device of an embodiment of the invention. Referring first to FIG. 1, in the present embodiment, a light-emitting device 100a includes a light-emitting unit 110a and a reflective protecting element 120. The light-emitting unit 110a has an upper surface 112a and a lower surface 114a opposite to each other, a side surface 116a connected to the upper surface 112a and the lower surface 114a, and a first electrode pad 113 and a second electrode pad 115 located on the lower surface 114a and separated from each other. The reflective protecting element 120 covers the side surface 116a of the light-emitting unit 110a and exposes at least a portion of the upper surface 112a and at least a portion of a first bottom surface 113a of the first electrode pad 113 and at least a portion of a second bottom surface 115a of the second electrode pad 115.

More specifically, in the present embodiment, as shown in FIG. 1, the upper surface 112a of the light-emitting unit 110a is aligned with a top surface 122 of the reflective protecting element 120, a bottom surface 124 of the reflective protecting element 120 is aligned with the first bottom surface 113a of the first electrode pad 113 and the second bottom surface 115a of the second electrode pad 115, and the reflective protecting element 120 can cover or expose the lower surface 114a of the light-emitting unit 110a located between the first electrode pad 113 and the second electrode pad 115. In the present embodiment, the side surface 116a of the light-emitting unit 110a is perpendicular to the upper surface 112a and the lower surface 114a, but is not limited thereto, and the light-emitting unit 110a is, for instance, a light-emitting diode (LED), and the emission wavelength of the LED is (including but not limited to) between 315 nm and 780 nm, and the LED includes, but is not limited to, UV, blue, green, yellow, orange, or red LED.

The reflectivity of the reflective protecting element 120 is at least greater than 90%. In other words, the reflective protecting element 120 of the present embodiment has the property of high reflectivity, wherein the material of the reflective protecting element 120 includes a polymer material doped with a highly reflective particle, and the highly reflective particle is, but not limited to, for instance, titanium dioxide ($TiO_2$) powder, and the highly reflective particle is, but not limited to, for instance, epoxy resin or silicone resin. Moreover, the material of the first electrode pad 113 and the second electrode pad 115 of the light-emitting unit 110a of the present embodiment is a metal material or metal alloy such as gold, aluminum, tin, silver, bismuth, indium, or a combination thereof, but is not limited thereto.

In the present embodiment, the reflective protecting element 120 covers the side surface 116a of the light-emitting unit 110a and exposes the first bottom surface 113a of the first electrode pad 113 and the second bottom surface 115a of the second electrode 115 of the light-emitting unit 110a. The light-emitting device 100a does not need a known bearing bracket to support and fix the light-emitting unit 110a and can effectively reduce package thickness and manufacturing cost. At the same time, the positive optical efficiency of the light-emitting unit 110a can also be increased via the reflective protecting element 120 having high reflectivity.

It should be mentioned here that, the following embodiments adopt the reference numerals of the embodiments above and a portion of the contents thereof, wherein the same reference numerals are adopted to represent the same or similar elements. Descriptions of the same technical content are as provided in the embodiments above and are not repeated in the following embodiments.

Figure 2:
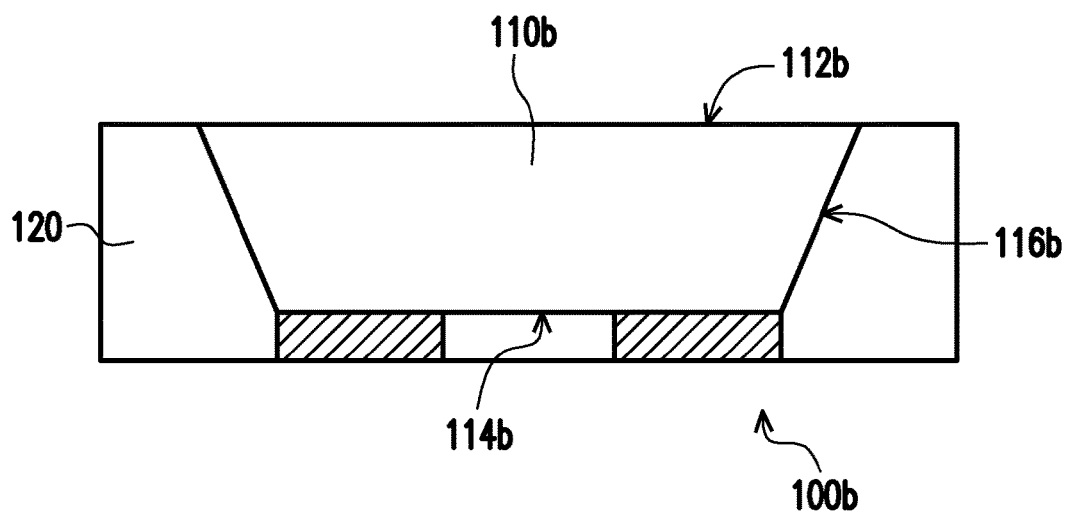
FIG. 2 shows a schematic of a light-emitting device of another embodiment of the invention.

FIG. 2 shows a schematic of a light-emitting device of another embodiment of the invention. Referring to both FIG. 1 and FIG. 2, the main differences between a light-emitting device 100b of the present embodiment and the light-emitting device 100a in FIG. 1 are that a side surface 116b of the light-emitting unit 110b of the present embodiment is not perpendicular to an upper surface 112b and a lower surface 114b, the surface area of the upper surface 112b is greater than the surface area of the lower surface 114b of the light-emitting unit 100b in the present embodiment, and the angle between the side surface 116b and the lower surface 114b is, for instance, between 95 degrees and 150 degrees. The contour defined by the upper surface 112b, the side surface 116b, and the lower surface 114b of the light-emitting unit 110b of the present embodiment is an inverted trapezoid, and therefore lateral emission of the light-emitting unit 110b can be reduced, and the reflective protecting element 120 having high reflectivity can further effectively increase the positive optical efficiency of the light-emitting unit 110b.

Figure 3:
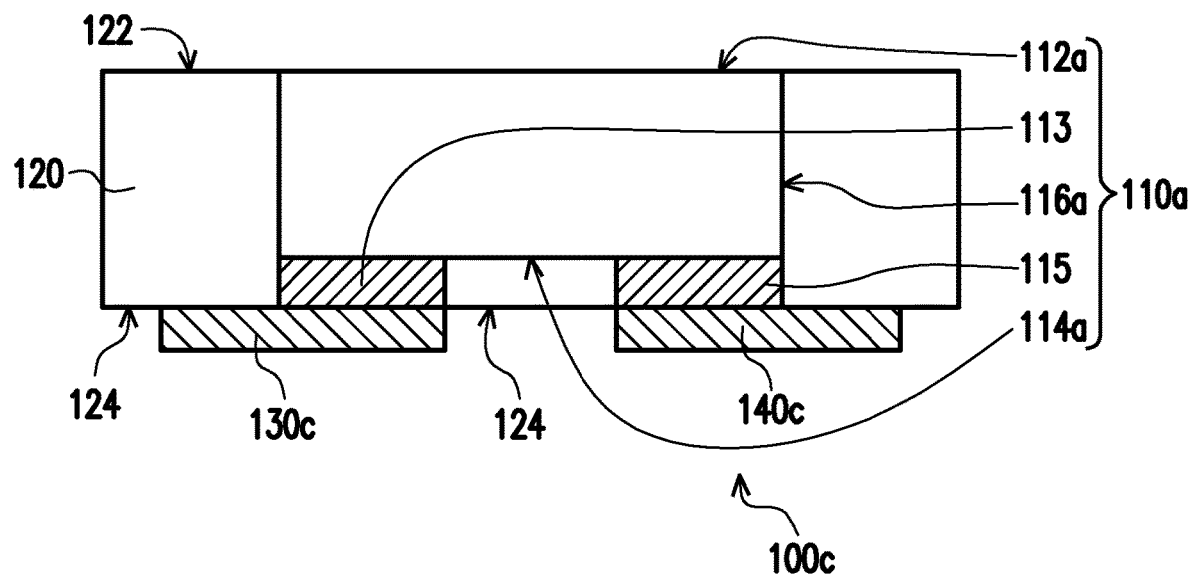
FIG. 3 shows a schematic of a light-emitting device of another embodiment of the invention.

FIG. 3 shows a schematic of a light-emitting device of another embodiment of the invention. Referring to both FIG. 1 and FIG. 3, the main difference between a light-emitting device 100c of the present embodiment and the light-emitting device 100a in FIG. 1 is that the light-emitting device 100c of the present embodiment further includes a first extension electrode 130c and a second extension electrode 140c. The first extension electrode 130c is disposed on the bottom surface 124 of the reflective protecting element 120 and electrically connected to the first electrode pad 113. The second extension electrode 140c is disposed on the bottom surface 124 of the reflective protecting element 120 and electrically connected to the second electrode pad 115. The first extension electrode 130c and the second extension electrode 140c are separated from each other and cover at least a portion of the bottom surface 124 of the reflective protecting element 120.

As shown in FIG. 3, the first extension electrode 130c and the second extension electrode 140c of the present embodiment are completely overlapped with the first electrode pad 113 and the second electrode pad 115 and extended toward the edges of the reflective protecting element 120. Of course, in other embodiments not shown, the first extension electrode 130c and the second extension electrode 140c can also be partially overlapped with the first electrode pad 113 and the second electrode pad 115, and any configuration satisfying the condition that the first extension electrode 130c and the second extension electrode 140c are electrically connected to the first electrode pad 113 and the second electrode pad 115 is within the scope of the present embodiment. Moreover, the first extension electrode 130c and the second extension electrode 140c of the present embodiment expose a portion of the bottom surface 124 of the reflective protecting element 120.

In the present embodiment, the material of the first extension electrode 130c and the second extension electrode 140c can be respectively the same or different from that of the first electrode pad 113 and the second electrode pad 115 of the light-emitting unit 110a. When the material of the first extension electrode 130c and the second extension electrode 140c is respectively the same as that of the first electrode pad 113 and the second electrode pad 115 of the light-emitting unit 110a, the first extension electrode 130c and the first electrode pad 113 can be seamlessly connected to form an integrally molded structure, and the second extension electrode 140c and the second electrode pad 115 can be seamlessly connected to form an integrally molded structure. When the material of the first extension electrode 130c and the second extension electrode 140c is respectively different from that of the first electrode pad 113 and the second electrode pad 115 of the light-emitting unit 110a, the material of the first extension electrode 130c and the second extension electrode 140c can be, for instance, silver, gold, bismuth, tin, indium, or an alloy of the above.

Since the light-emitting device 100c of the present embodiment has the first extension electrode 130c and the second extension electrode 140c respectively electrically connected to the first electrode pad 113 and the second electrode pad 115 of the light-emitting unit 110a, the electrode contact area of the light-emitting device 100c can be effectively increased to facilitate the subsequent assembly of the light-emitting device 100c with other external circuits to effectively increase alignment accuracy and assembly efficiency. For instance, the area of the first extension electrode 130c is greater than the area of the first electrode pad 113, and the area of the second extension electrode 140c is greater than the area of the second electrode pad 115.

Figure 4:
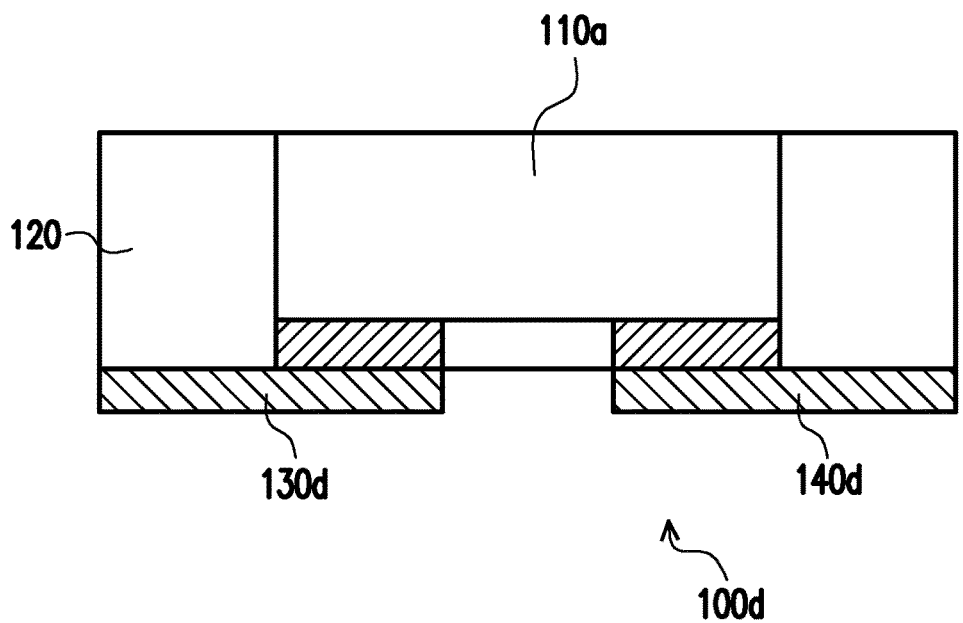
FIG. 4 shows a schematic of a light-emitting device of another embodiment of the invention.

FIG. 4 shows a schematic of a light-emitting device of another embodiment of the invention. Referring to both FIG. 3 and FIG. 4, the main difference between a light-emitting device 100d of the present embodiment and the light-emitting device 100c in FIG. 3 is that the edges of a first extension electrode 130d and the edges of a second extension electrode 140d of the present embodiment are aligned with the edges of the reflective protecting element 120.

Figure 5:
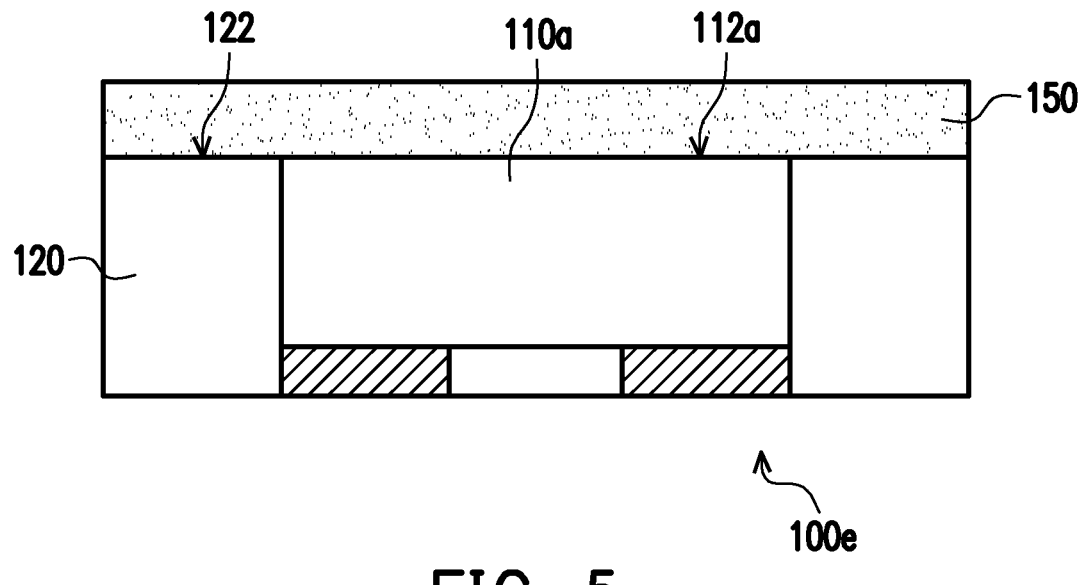
FIG. 5 shows a schematic of a light-emitting device of another embodiment of the invention.

FIG. 5 shows a schematic of a light-emitting device of another embodiment of the invention. Referring to both FIG. 1 and FIG. 5, the main difference between a light-emitting device 100e of the present embodiment and the light-emitting device 100a in FIG. 1 is that the light-emitting device 100e of the present embodiment further includes a packaging adhesive layer 150, wherein the packaging adhesive layer 150 is disposed on the upper surface 112a of the light-emitting unit 110a to increase light extraction rate and improve light pattern. The packaging adhesive layer 150 can also be extended to at least a portion of the upper surface 122 of the reflective protecting element 120, and the edges of the packaging adhesive layer 150 can also be aligned with the edges of the reflective protecting element 120. Moreover, at least one wavelength conversion material can also be doped inside the packaging adhesive layer 150, and the wavelength conversion material is used for converting the wavelength of at least a portion of the light emitted by the light-emitting unit 110a into other wavelengths, and the wavelength conversion material includes a fluorescent material, phosphorescent material, dye, quantum dot material, or a combination thereof, wherein the particle size of the wavelength conversion material is, for instance, between 3 microns and 50 microns. Moreover, an oxide having high scattering power can also be doped inside the packaging adhesive layer 150, such as titanium dioxide ($TiO_2$) or silicon dioxide ($SiO_2$) to increase optical efficiency.

In an embodiment of the invention, the light-emitting unit includes, but is not limited to, a UV, blue, green, yellow, orange, or red light-emitting unit, and the wavelength conversion material includes, but is not limited to, a red, orange, orange-yellow, yellow, yellow-green, or green wavelength conversion material or a combination thereof for converting a portion or all of the wavelength of the light emitted by the light-emitting unit. After light from the wavelength conversion and light without wavelength conversion are mixed, the light-emitting device emits light in a specific range of the dominant wavelength, and the light color thereof includes, but not limited to, for instance, red, orange, orange-yellow, amber, yellow, yellow-green, or green, or white light having a specific relative color temperature is emitted, and the range of the relative color temperature is, for instance, between 2500 K and 7000 K, but is not limited thereto.

Figure 6:
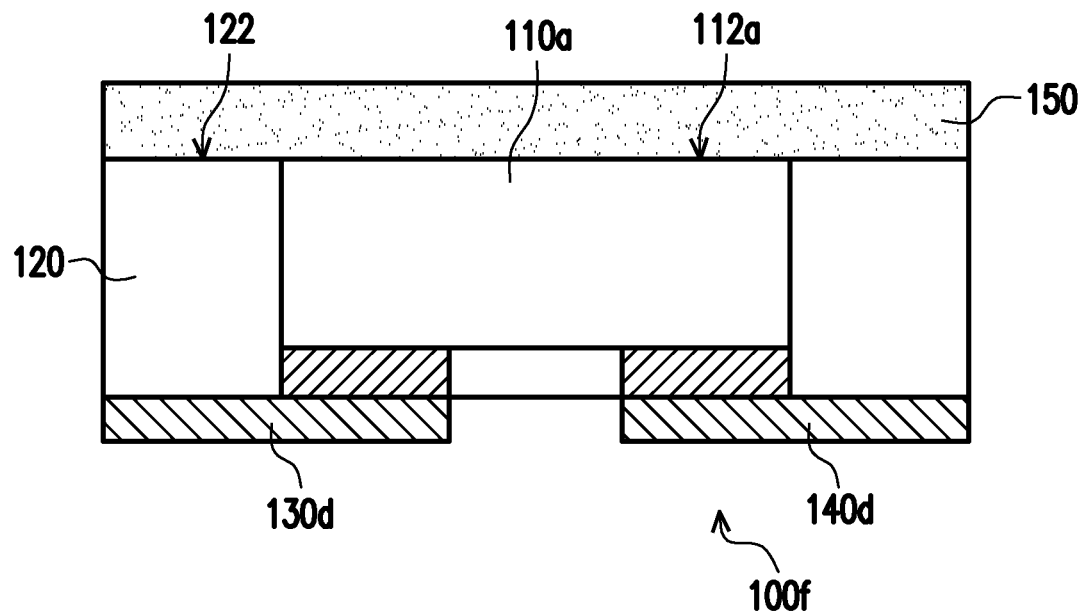
FIG. 6 shows a schematic of a light-emitting device of another embodiment of the invention.

FIG. 6 shows a schematic of a light-emitting device of another embodiment of the invention. Referring to both FIG. 6 and FIG. 4, the main difference between a light-emitting device 100f of the present embodiment and the light-emitting device 100d in FIG. 4 is that the light-emitting device 100f of the present embodiment further includes a packaging adhesive layer 150, wherein the packaging adhesive layer 150 is disposed on the upper surface 112a of the light-emitting unit 110a to increase light extraction rate and improve light pattern. The packaging adhesive layer 150 can also be extended to at least a portion of the upper surface 122 of the reflective protecting element 120, and the edges of the packaging adhesive layer 150 can also be aligned with the edges of the reflective protecting element 120. Moreover, at least one wavelength conversion material can also be doped inside the packaging adhesive layer 150, the wavelength conversion material is used for converting the wavelength of at least a portion of the light emitted by the light-emitting unit 110a into other wavelengths, and the wavelength conversion material includes a fluorescent material, phosphorescent material, dye, quantum dot material, or a combination thereof, wherein the particle size of the wavelength conversion material is, for instance, between 3 microns and 50 microns. Moreover, an oxide having high scattering power can also be doped inside the packaging adhesive layer 150, such as titanium dioxide ($TiO_2$) or silicon dioxide ($SiO_2$) to increase optical efficiency.

It should be mentioned that, in the embodiments of FIG. 4 and FIG. 6, the edges of the first extension electrode 130d and the edges of the second extension electrode 140d are aligned with the edges of the reflective protecting element 120. This design not only can expand the contact area of the electrode, but in the manufacturing process, the reflective protecting element 120 can package a plurality of light-emitting units 110a separated from one another at the same time, and then a patterned metal layer is formed to respectively form the first extension electrode 130d and the second extension electrode 140d, and then cutting is performed such that the edges of the first extension electrode 130d and the edges of the second extension electrode 140d of each of the light-emitting devices 100f are aligned with the edges of the reflective protecting element 120 to effectively reduce process time.

Figure 7:
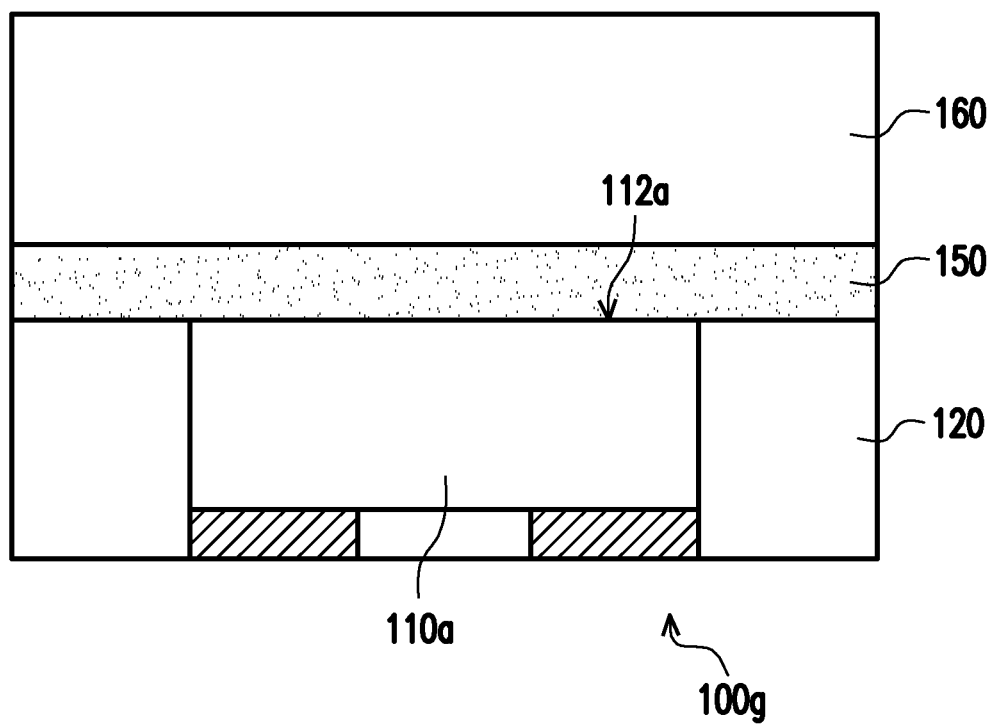
FIG. 7 shows a schematic of a light-emitting device of another embodiment of the invention.

FIG. 7 shows a schematic of a light-emitting device of another embodiment of the invention. Referring to both FIG. 7 and FIG. 5, the main difference between a light-emitting device 100g of the present embodiment and the light-emitting device 100*e* in FIG. 5 is that the light-emitting device 100*g* of the present embodiment further includes a translucent layer 160 disposed on the packaging adhesive layer 150, wherein the light transmittance of the translucent layer 160 is, for instance, greater than 50%. In the present embodiment, the material of the translucent layer 160 is, for instance, glass, ceramic, resin, acrylic, or silicone, and the object thereof is to guide the light generated by the light-emitting unit 110*a* to the outside to effectively increase luminous flux and light extraction rate of the light-emitting device 100*g*, and the light-emitting unit 110*a* can also be effectively protected to block outside water vapor and oxygen.

Figure 8:
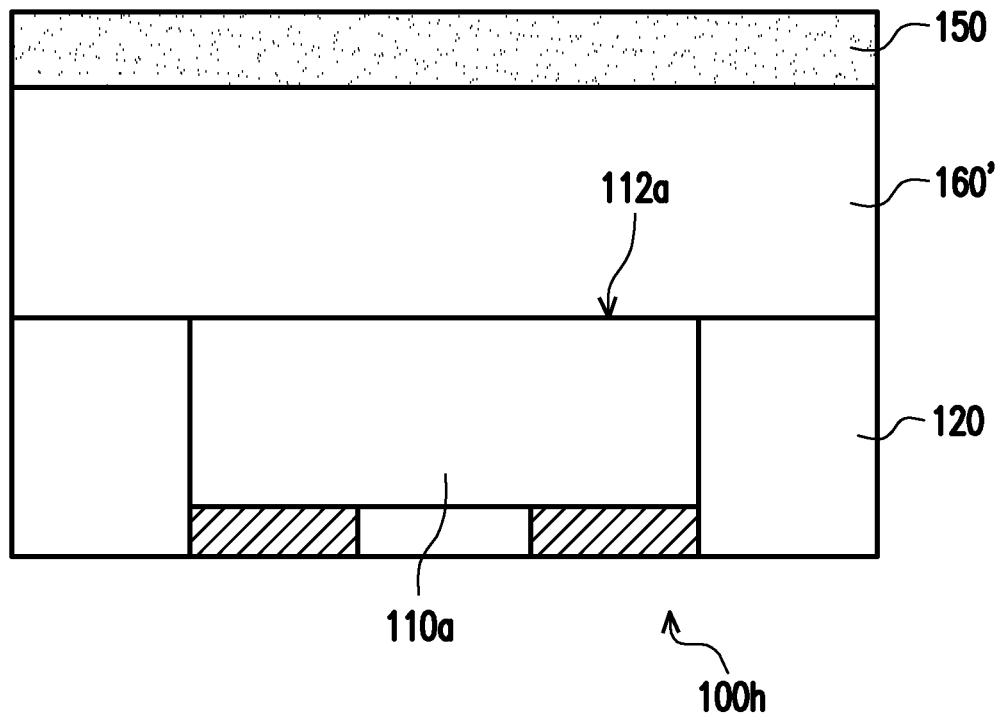
FIG. 8 shows a schematic of a light-emitting device of another embodiment of the invention.

FIG. 8 shows a schematic of a light-emitting device of another embodiment of the invention. Referring to both FIG. 8 and FIG. 7, the main difference between a light-emitting device 100*h* of the present embodiment and the light-emitting device 100*g* in FIG. 7 is that a translucent layer 160' of the light-emitting device 100*h* of the present embodiment is disposed between the upper surface 110*a* of the light-emitting unit 110*a* and the packaging adhesive layer 150.

Figure 9:
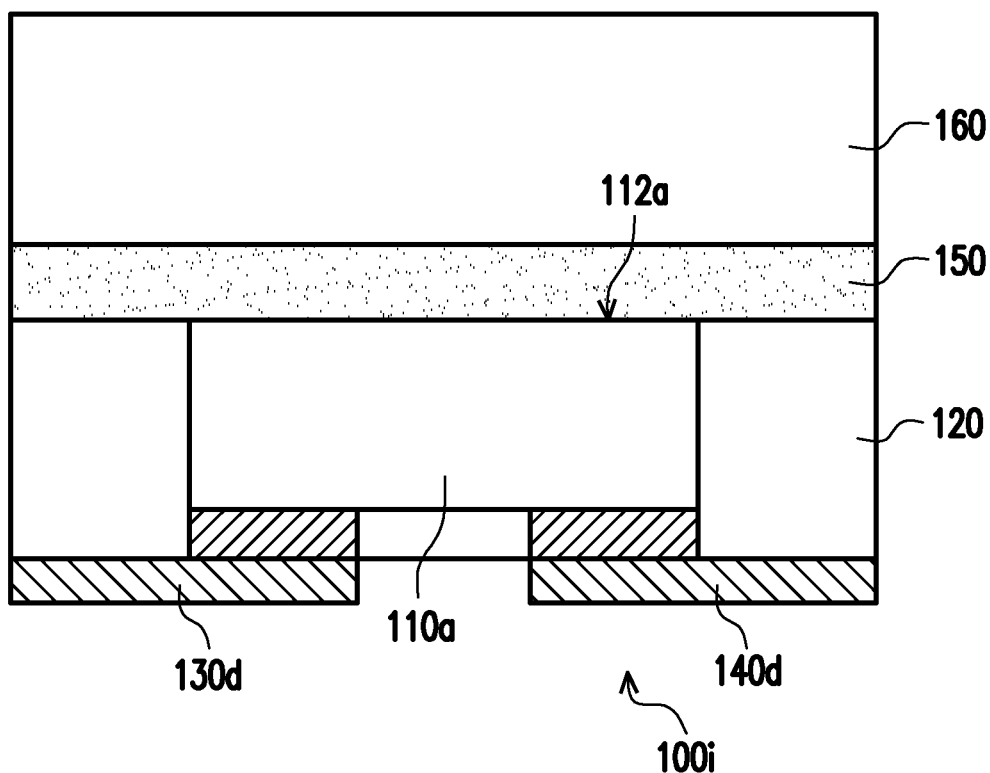
FIG. 9 shows a schematic of a light-emitting device of another embodiment of the invention.

FIG. 9 shows a schematic of a light-emitting device of another embodiment of the invention. Referring to both FIG. 9 and FIG. 6, the main difference between a light-emitting device 100*i* of the present embodiment and the light-emitting device 100*f* in FIG. 6 is that the light-emitting device 100*i* of the present embodiment further includes a translucent layer 160 disposed on the packaging adhesive layer 150, wherein the light transmittance of the translucent layer 160 is, for instance, greater than 50%. In the present embodiment, the material of the translucent layer 160 is, for instance, glass, ceramic, resin, acrylic, or silicone, and the object thereof is to guide the light generated by the light-emitting unit 110*a* to the outside to effectively increase the luminous flux and light extraction rate of the light-emitting device 100*i*, and the light-emitting unit 110*a* can also be effectively protected to block outside water vapor and oxygen.

In the following, the light-emitting devices 100*a*, 100*g*, 100*d*, and 100*i* in FIG. 1, FIG. 7, FIG. 4, and FIG. 9 are exemplified, and the manufacturing method of the light-emitting device of the invention is described in detail respectively with FIG. 10A to FIG. 10D, FIG. 11A to FIG. 11C, FIG. 12A to FIG. 12E, and FIG. 13A to FIG. 13D.

FIG. 10A to FIG. 10D show cross sections of a manufacturing method of a light-emitting device of an embodiment of the invention. First, referring to FIG. 10A, a plurality of light-emitting units 110*a* is disposed on a substrate 10, wherein each of the light-emitting units 110*a* has an upper surface 112*a* and a lower surface 114*a* opposite to each other, a side surface 116*a* connected to the upper surface 112*a* and the lower surface 114*a*, and a first electrode pad 113 and a second electrode pad 115 located on the lower surface 114*a* and separated from each other. The first electrode pad 113 and the second electrode pad 115 of each of the light-emitting units 110*a* are disposed on the substrate 10. In other words, the light-emitting surface of the light-emitting unit 110*a*, i.e., the upper surface 112*a*, is relatively far from the substrate 10. In the embodiment, the material of the substrate 10 is, for instance, stainless steel, ceramic, or other non-conductive materials. The light-emitting unit 110*a* is, for instance, an LED, and the emission wavelength of the LED is (including but not limited to) between 315 nm and 780 nm, and the LED includes, but is not limited to, UV, blue, green, yellow, orange, or red LED.

Figure 10A:
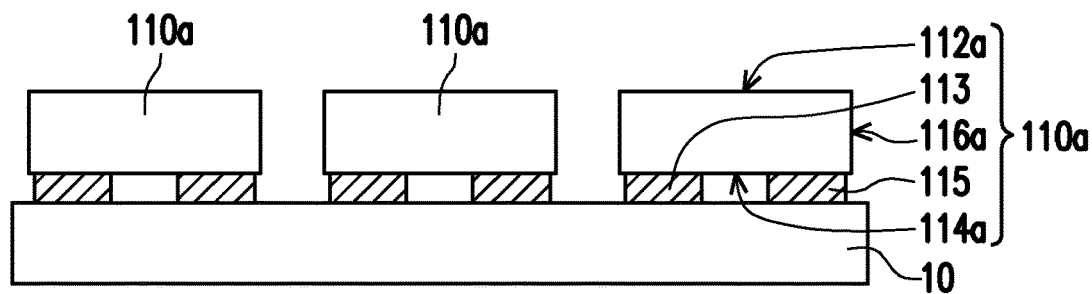
FIG. 10A to FIG. 10D show cross sections of a manufacturing method of a light-emitting device of an embodiment of the invention.
Figure 10B:
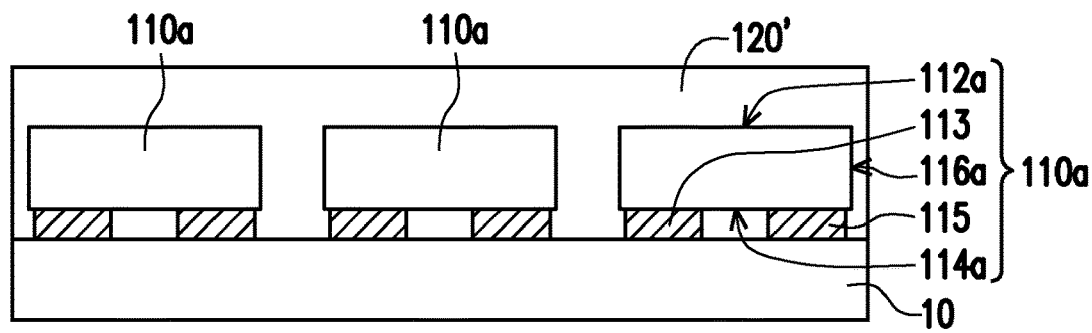

Next, referring to FIG. 10B, a reflective protecting element 120' is formed on the substrate 10, wherein the reflective protecting element 120' covers each of the light-emitting units 110*a*. In other words, the reflective protecting element 120' completely and directly covers the upper surface 112*a*, the lower surface 114*a*, and the side surface 116*a* of the light-emitting unit 110*a* and completely fills the gap between the first electrode pad 113 and the second electrode pad 115. Here, the reflectivity of the reflective protecting element 120' is at least greater than 90%. In other words, the reflective protecting element 120' of the present embodiment can have the property of high reflectivity, wherein the material of the reflective protecting element 120' includes a polymer material doped with a highly reflective particle, and the highly reflective particle is, but not limited to, for instance, titanium dioxide ($TiO_2$) powder, and the highly reflective particle is, but not limited to, for instance, epoxy resin or silicone resin.

Figure 10C:
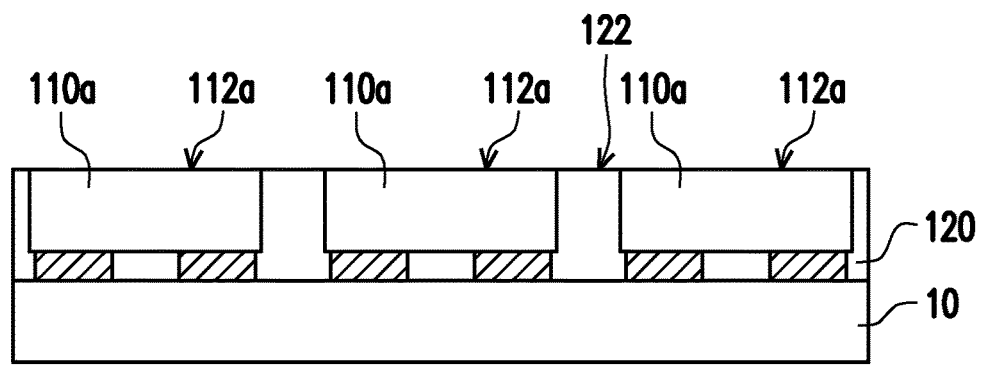

Next, referring to FIG. 10C, a portion of the reflective protecting element 120' is removed to form the reflective protecting element 120, wherein the reflective protecting element 120 exposes at least a portion of the upper surface 112*a* of each of the light-emitting units 110*a*. At this point, the upper surface 112*a* of each of the light-emitting units 110*a* may be aligned with the top surface 122 of the reflective protecting element 120. At this point, the method of removing a portion of the reflective protecting element 120' includes, for instance, a polishing method.

Figure 10D:
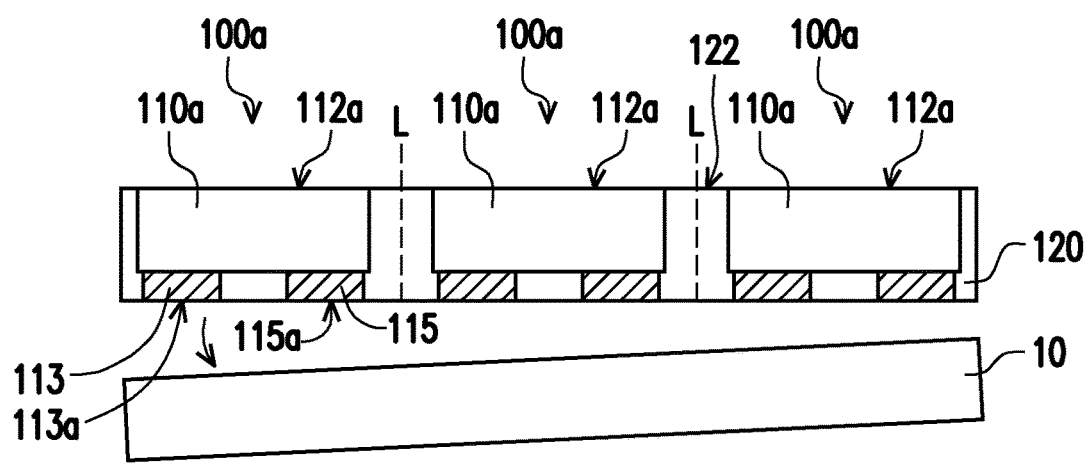

Next, referring to FIG. 10D, a cutting process is performed to cut the reflective protecting element 120 along a cutting line L to form a plurality of light-emitting devices 100*a* separated from one another, wherein each of the light-emitting devices 100*a* respectively has at least one light-emitting unit 110*a* and a reflective protecting element 120, and the reflective protecting element 120 covers the side surface 116*a* of the light-emitting unit 110*a* and exposes at least a portion of the upper surface 112*a* thereof.

Lastly, referring further to FIG. 10D, the substrate 10 is removed to expose the bottom surface 124 of the reflective protecting element 120 of each of the light-emitting devices 100*a* and expose at least a portion of the first bottom surface 113*a* of the first electrode pad 113 and at least a portion of the second bottom surface 115*a* of the second electrode pad 115 of each of the light-emitting devices 100*a*.

Figure 11A:
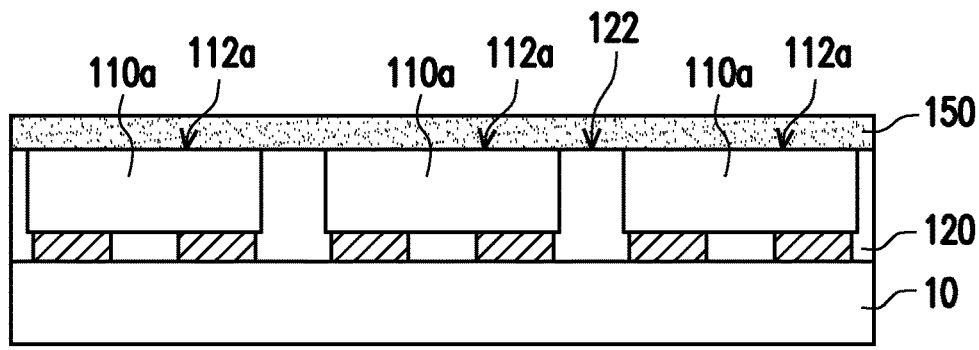
FIG. 11A to FIG. 11C show cross sections of some of the steps of a manufacturing method of a light-emitting device of another embodiment of the invention.
Figure 11B:
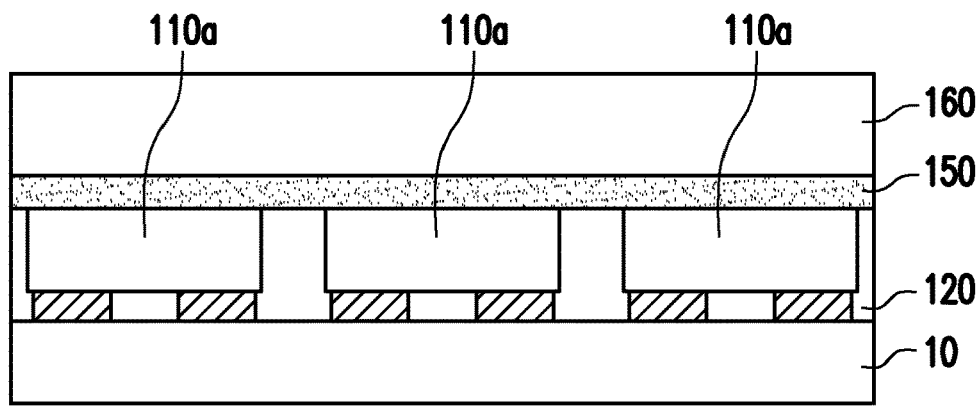
Figure 11C:
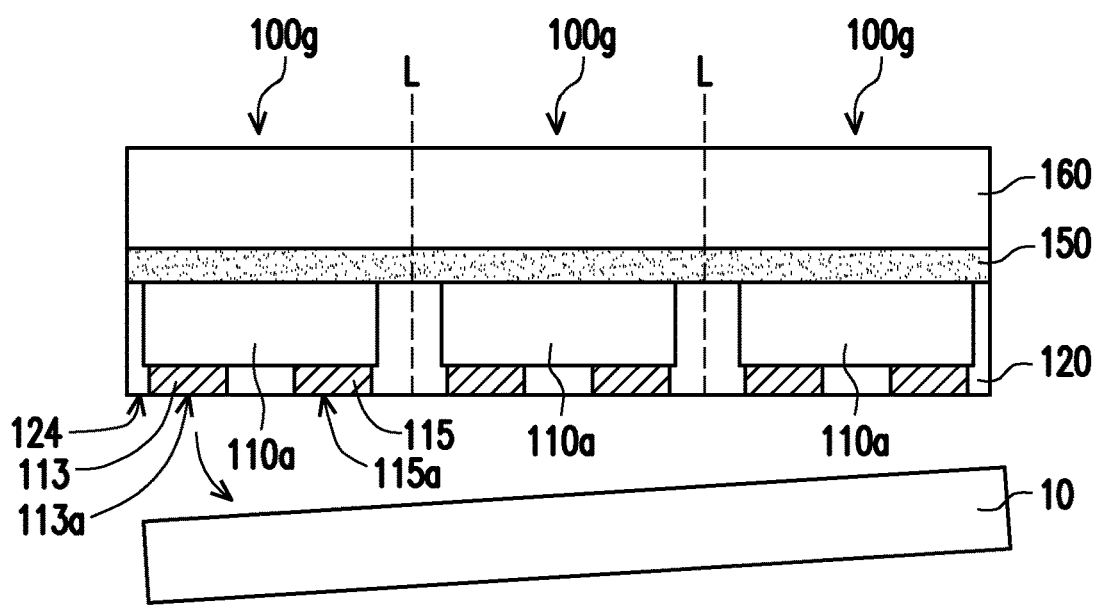

FIG. 11A to FIG. 11C show cross sections of some of the steps of a manufacturing method of a light-emitting device of another embodiment of the invention. The main difference between the manufacturing method of the light-emitting device of the present embodiment and the manufacturing method of the light-emitting device in FIG. 10A to FIG. 10D is that, between the steps of FIG. 10C and FIG. 10D, that is, after a portion of the reflective protecting element 120' is removed and before the cutting process is performed, referring to FIG. 11A, the packaging adhesive layer 150 is formed on the light-emitting unit 110*a* and the reflective protecting element 120 to increase light extraction rate and improve light pattern. Here, the packaging adhesive layer 150 covers the upper surface 112*a* of the light-emitting unit 110*a* and the top surface 122 of the reflective protecting element 120, and at least one wavelength conversion material can also be doped inside the packaging adhesive layer 150. The description of the wavelength conversion material is as provided in the embodiments above. Moreover, an oxide having high scattering power can also be doped inside the packaging adhesive layer 150, such as titanium dioxide ($TiO_2$) or silicon dioxide ($SiO_2$) to increase optical efficiency.

Next, referring to FIG. 11B, a translucent layer 160 is formed on the light-emitting unit 110*a* and the reflective protecting element 120, wherein the translucent layer 160 is located on the packaging adhesive layer 150 and covers the packaging adhesive layer 150. For instance, the light transmittance of the translucent layer 160 is greater than 50%. In the present embodiment, the material of the translucent layer 160 is, for instance, glass, ceramic, resin, acrylic, or silicone, and the object thereof is to guide the light generated by the light-emitting unit 110a to the outside to effectively increase the luminous flux and light extraction rate of the subsequent light-emitting unit packaging structure 100g, and the light-emitting unit 110a can also be effectively protected to block outside water vapor and oxygen.

Next, referring to FIG. 11C, a cutting process is performed to cut the translucent layer 160, the packaging adhesive layer 150, and the reflective protecting element 120 along the cutting line L to form a plurality of light-emitting devices 100g separated from one another. Lastly, referring further to FIG. 11C, the substrate 10 is removed to expose the bottom surface 124 of the reflective protecting element 120 of each of the light-emitting devices 100g, wherein the bottom surface 124 of the reflective protecting element 120 of each of the light-emitting devices 100g exposes at least a portion of the first bottom surface 113a of the first electrode pad 113 and at least a portion of the second bottom surface 115a of the second electrode pad 115. In another embodiment of the invention, the substrate 10 can also be removed first before a cutting process is performed.

Figure 12A:
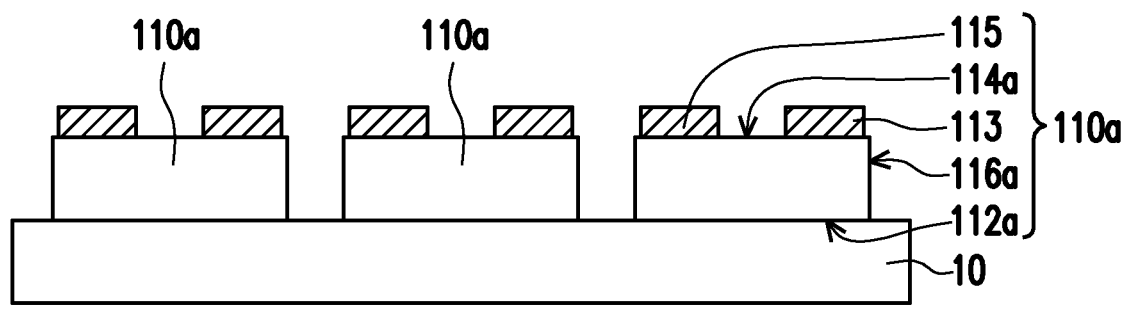
FIG. 12A to FIG. 12E show cross sections of a manufacturing method of a light-emitting device of another embodiment of the invention.

FIG. 12A to FIG. 12E show cross sections of a manufacturing method of a light-emitting device of another embodiment of the invention. Referring first to FIG. 12A, the main difference between the manufacturing method of the light-emitting device of the present embodiment and the manufacturing method of the light-emitting device in FIG. 10A to FIG. 10D is that, referring to FIG. 12A, the light-emitting unit 110a of the present embodiment is not in contact with the substrate 10 via the first electrode pad 113 and the second electrode pad 115, but is in contact with the substrate 10 via the upper surface 112a thereof.

Figure 12B:
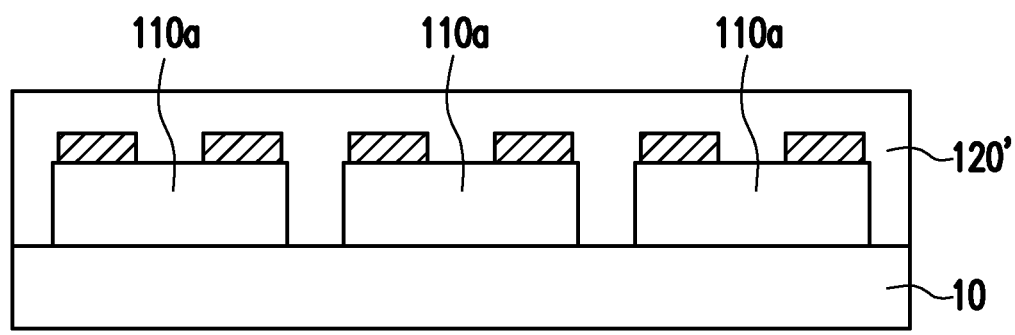

Next, referring to FIG. 12B, a reflective protecting element 120' is formed on the substrate, wherein the reflective protecting element covers each of the light-emitting units 110a.

Figure 12C:
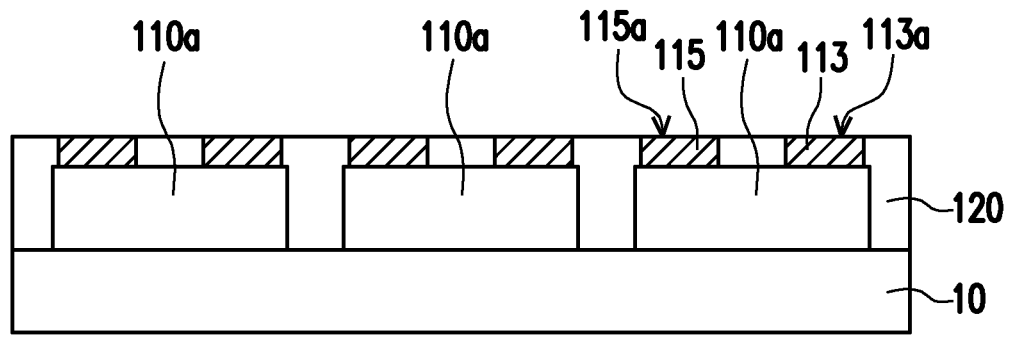

Next, referring to FIG. 12C, a portion of the reflective protecting element 120' is removed to form the reflective protecting element 120, wherein the reflective protecting element 120 exposes at least a portion of the first bottom surface 113a of the first electrode pad 113 and at least a portion of the second bottom surface 115a of the second electrode pad 115 of each of the light-emitting units 110a.

Figure 12D:
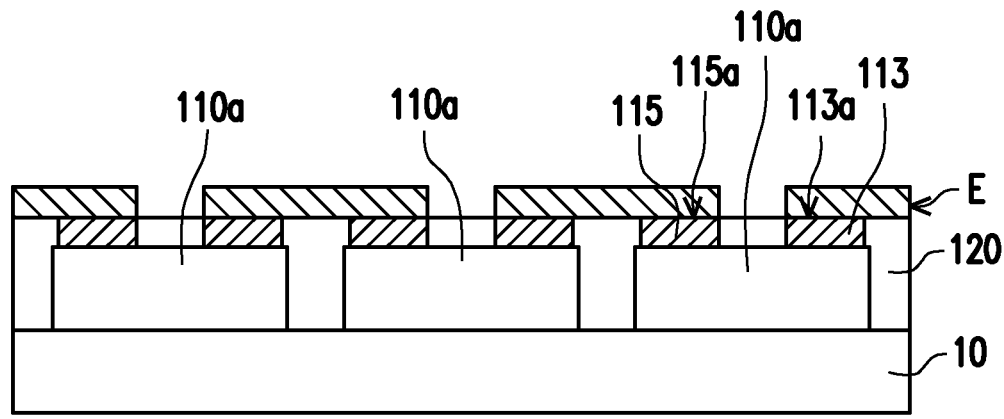

Next, referring to FIG. 12D, a patterned metal layer is formed as an extension electrode layer E located on the first bottom surface 113a of the first electrode pad 113 and on the second bottom surface 115a of the second electrode pad 115 of each of the light-emitting unit 110a. Here, the method of forming the patterned metal layer includes, for instance, evaporation, sputtering, electroplating, or electroless plating and photomask etching.

Figure 12E:
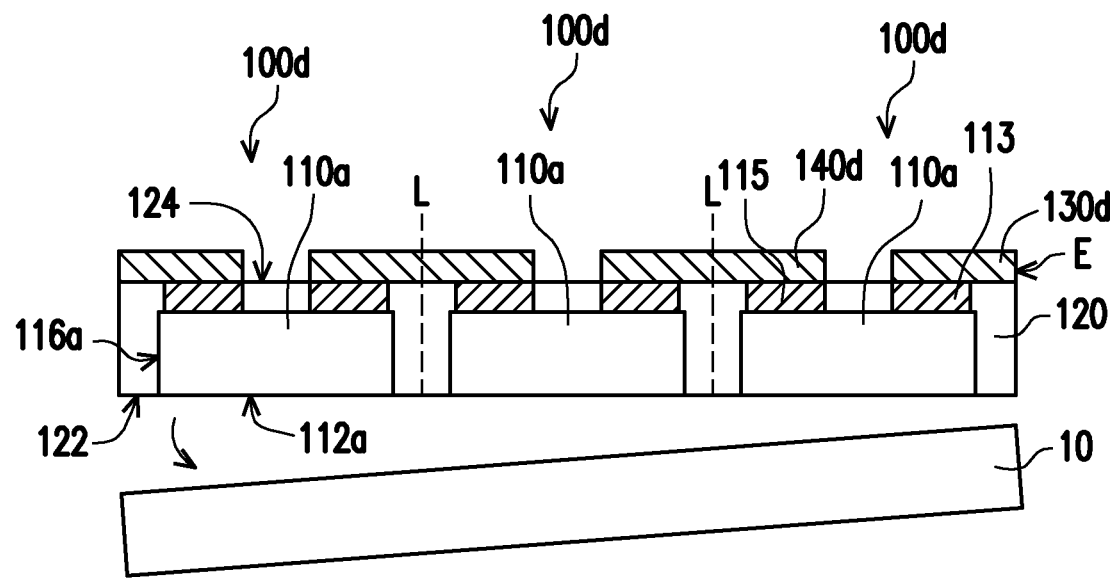

Next, referring to FIG. 12E, a cutting process is performed to cut the extension electrode layer E and the reflective protecting element 120 along a cutting line to form a plurality of light-emitting devices 100d separated from one another. Each of the light-emitting devices 100d respectively has at least one light-emitting unit 110a, a reflective protecting element 120 at least covering the side surface 116a of the light-emitting unit 110a, a first extension electrode 130d directly in contact with the first electrode pad 113, and a second extension electrode 140 directly in contact with the second electrode pad 115. The first extension electrode 130d and the second extension electrode 140d are separated from each other and expose at least a portion of the bottom surface 124 of the reflective protecting element 120. At this point, the area of the first extension electrode 130d can be greater than the area of the first electrode pad 113, and the area of the second extension electrode 140d can be greater than the area of the second electrode pad 115. The edges of the first extension electrode 130d and the edges of the second extension electrode 140d are aligned with the edges of the reflective protecting element 120.

Lastly, referring further to FIG. 12E, the substrate 12 is removed to expose the top surface 122 of the reflective protecting element 120 of each of the light-emitting devices 100d and the upper surface 112a of the light-emitting unit 110a, wherein the top surface 122 of the reflective protecting element 120 of each of the light-emitting devices 100g is aligned with the upper surface 112a of the light-emitting unit 110a. In another embodiment of the invention, the substrate 10 can also be removed first before a cutting process is performed.

FIG. 13A to FIG. 13D show cross sections of some of the steps of a manufacturing method of a light-emitting device of another embodiment of the invention. The main difference between the manufacturing method of the light-emitting device of the present embodiment and the manufacturing method of the light-emitting device in FIG. 12A to FIG. 12E is that, between the steps of FIG. 12D and FIG. 12E, that is, after the extension electrode layer E is formed and before the cutting process is performed, referring to FIG. 13A, another substrate 20 is provided and disposed on the extension electrode layer E. Here, the material of the other substrate 20 is, for instance, stainless steel, ceramic, or other non-conductive materials. Next, referring further to FIG. 13A, the substrate 10 is removed after the other substrate 20 is provided to expose the top surface 122 of the reflective protecting element 120 and the upper surface 112a of the light-emitting unit 110a, wherein the upper surface 112a of each of the light-emitting units 110a is aligned with the top surface 122 of the reflective protecting element 120.

Figure 13A:
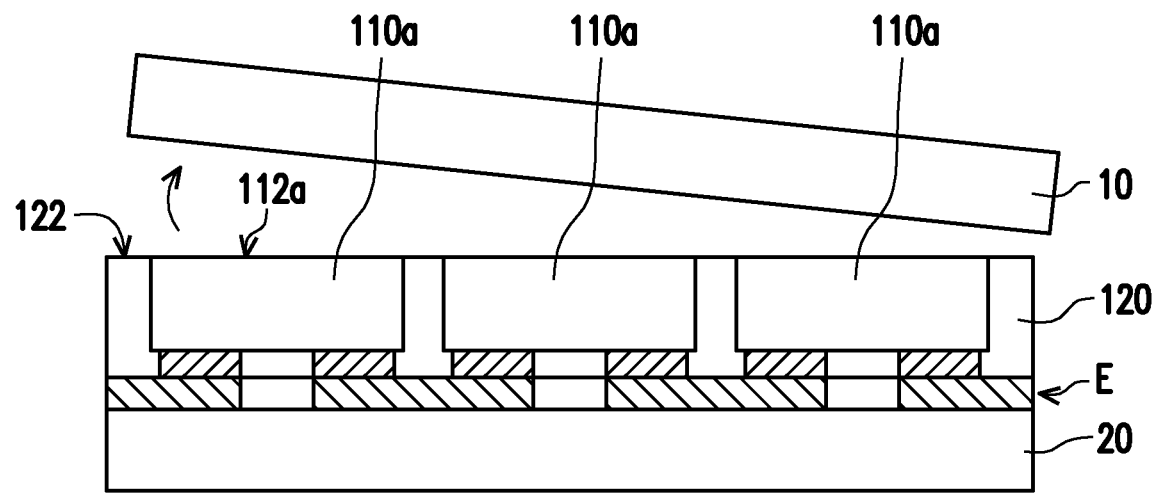
FIG. 13A to FIG. 13D show cross sections of some of the steps of a manufacturing method of a light-emitting device of another embodiment of the invention.
Figure 13B:
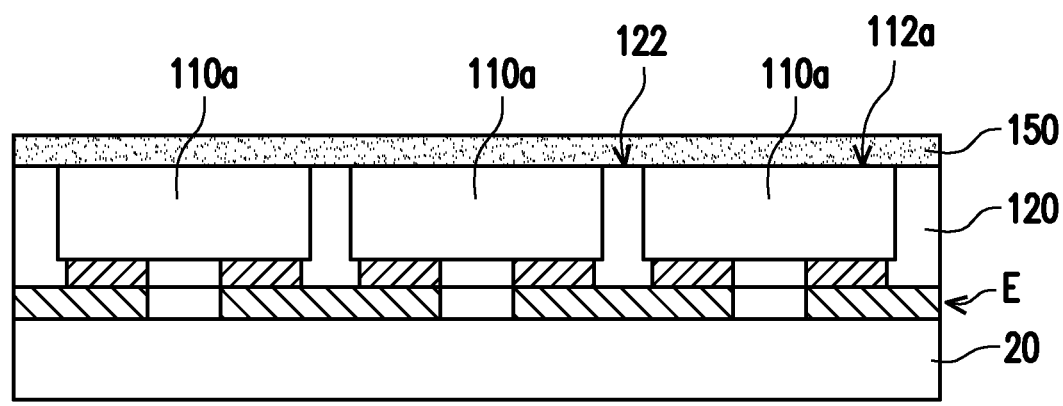

Next, referring to FIG. 13B, the packaging adhesive layer 150 is formed on the light-emitting unit 110a and the reflective protecting element 120 to increase light extraction rate and improve light pattern. Here, the packaging adhesive layer 150 covers the upper surface 112a of the light-emitting unit 110a and the top surface 122 of the reflective protecting element 120, and at least one wavelength conversion material can also be doped inside the packaging adhesive layer 150. The description of the wavelength conversion material is as provided in the embodiments above. Moreover, an oxide having high scattering power can also be doped inside the packaging adhesive layer 150, such as titanium dioxide ($TiO_2$) or silicon dioxide ($SiO_2$) to increase optical efficiency.

Figure 13C:
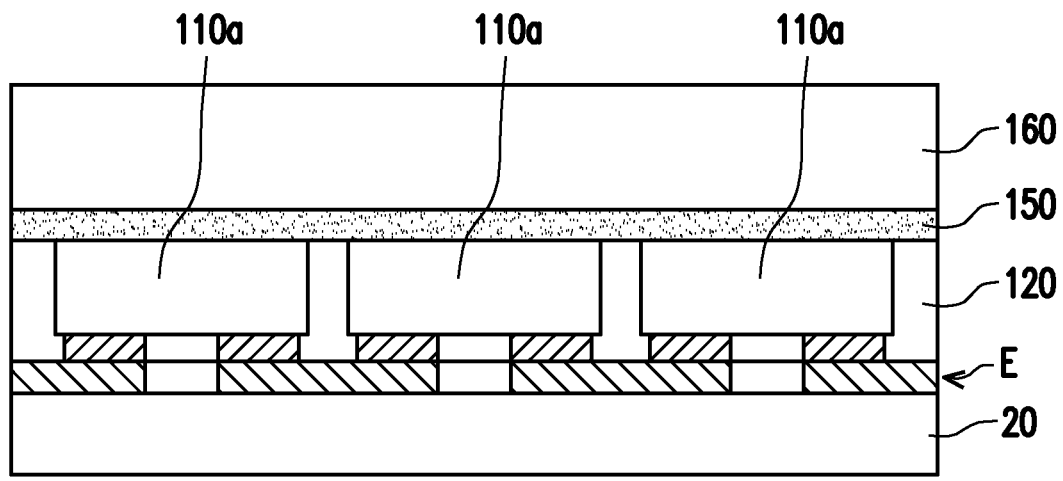

Next, referring to FIG. 13C, a translucent layer 160 is formed on the light-emitting unit 110a and the reflective protecting element 120, wherein the translucent layer 160 is located on the packaging adhesive layer 150 and covers the packaging adhesive layer 150. For instance, the light transmittance of the translucent layer 160 is greater than 50%. Here, the material of the translucent layer 160 is, for instance, glass, ceramic, resin, acrylic, or silicone, and the object thereof is to guide the light generated by the light-emitting unit 110a to the outside to effectively increase luminous flux and light extraction rate of the subsequent light-emitting device 100i, and the light-emitting unit 110a can also be effectively protected to prevent impact from outside water vapor and oxygen.

Figure 13D:
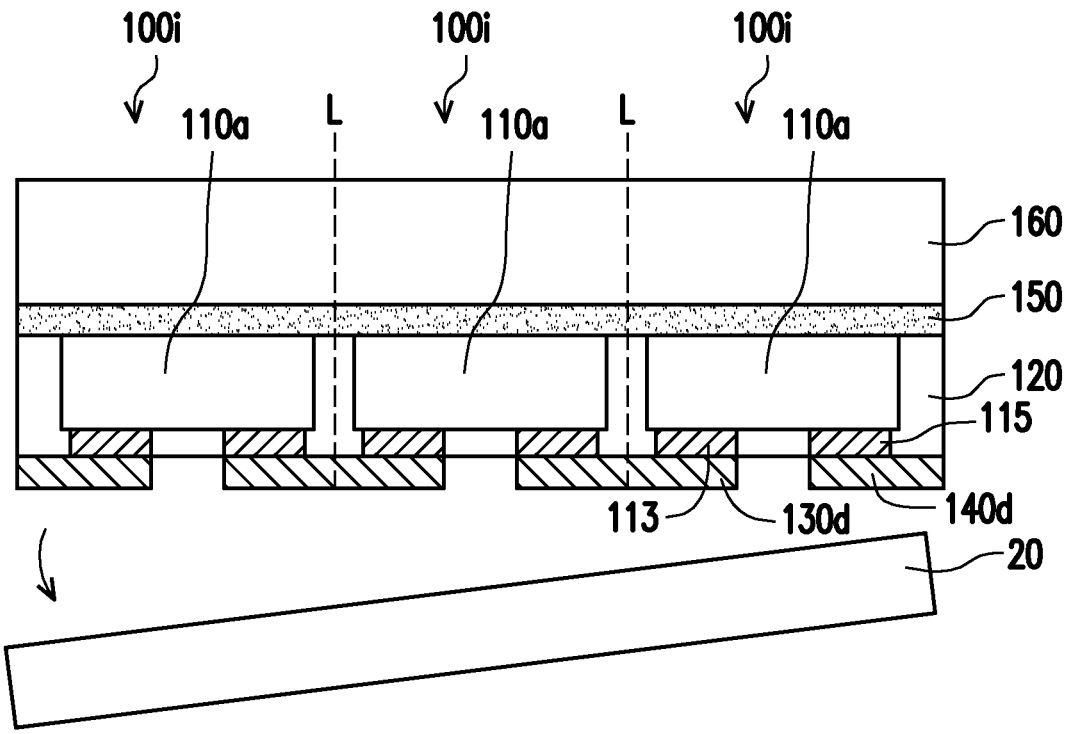

Next, referring to FIG. 13D, a cutting process is performed to cut the translucent layer 160, the packaging adhesive layer 150, the reflective protecting element 120, and the extension electrode layer E along the cutting line L to form a plurality of light-emitting devices 100*i* separated from one another. Lastly, referring further to FIG. 13D, the other substrate 20 is removed to expose the first extension electrode 130*d* and the second extension electrode 140*d* of each of the light-emitting devices 100*i*. In another embodiment of the invention, the substrate 20 can also be removed first before a cutting process is performed.

Figure 14A:
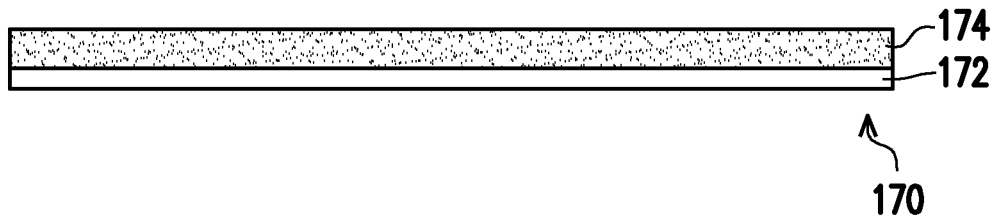
FIG. 14A to FIG. 14E show cross sections of a manufacturing method of a light-emitting device of another embodiment of the invention.
Figure 14A:
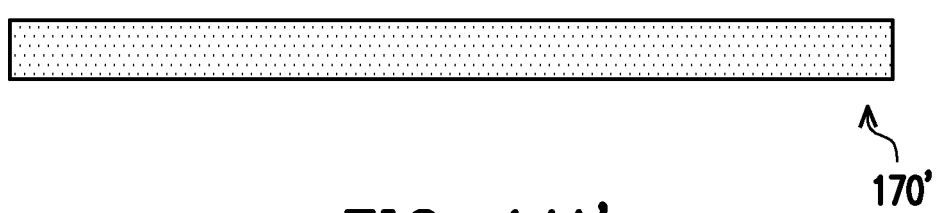

FIG. 14A to FIG. 14E show cross sections of a manufacturing method of a light-emitting device of another embodiment of the invention. Referring first to FIG. 14A, a wavelength conversion adhesive layer 170 is provided, wherein the wavelength conversion adhesive layer 170 includes a low-concentration fluorescent adhesive layer 174 and a high-concentration fluorescent adhesive layer 172 located on the low-concentration fluorescent adhesive layer 174. Here, the steps of forming the wavelength conversion adhesive layer 170 include, for instance, first mixing a dopant and a colloid (i.e., evenly mixing a liquid or molten colloid with a wavelength conversion material, and the wavelength conversion material is, for instance, fluorescent powder, but is not limited thereto) to form the wavelength conversion adhesive layer 170. Next, the wavelength conversion adhesive layer 170 is left to stand for a period of time, such as 24 hours, to precipitate to form the high-concentration fluorescent adhesive layer 172 and the low-concentration fluorescent adhesive layer 174 separated into upper and lower layers. In other words, the wavelength conversion layer 170 of the present embodiment is exemplified by two adhesive layers. Of course, in other embodiments, referring to FIG. 14A', a wavelength conversion adhesive layer 170' is provided as a single adhesive layer, which is still within the scope of the invention.

Figure 14B:
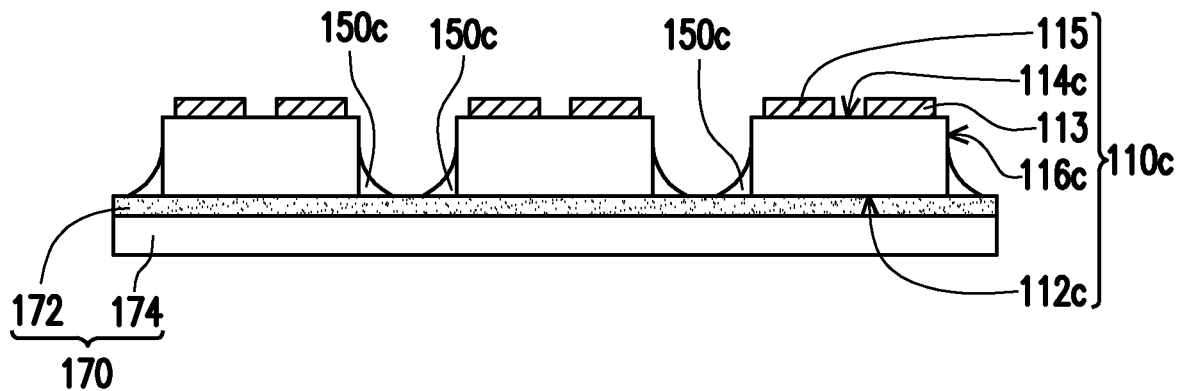
Figure 14B:
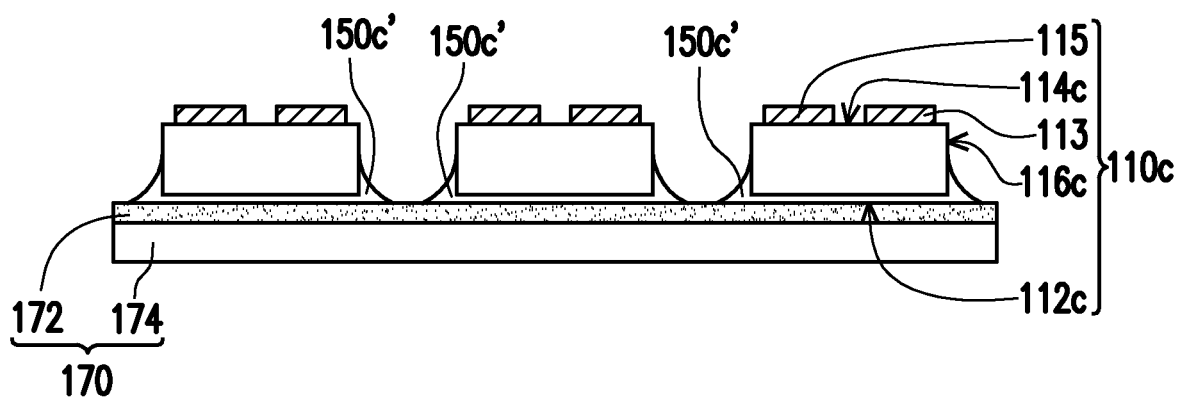

Next, referring to FIG. 14B, a plurality of light-emitting units 110*c* arranged at intervals is disposed on the wavelength conversion adhesive layer 170, wherein each of the light-emitting units 110*c* has an upper surface 112*c* and a lower surface 114*c* opposite to each other, a side surface 116*c* connected to the upper surface 112*c* and the lower surface 114*c*, and a first electrode pad 113 and a second electrode pad 115 located on the lower surface 114*c* and separated from each other, and the upper surface 112*c* of the light-emitting unit 110*c* is located on the high-concentration fluorescent adhesive layer 172 of the wavelength conversion adhesive layer 170. Next, a plurality of translucent adhesive layers 150*c* for which the material contains a transparent colloid is formed on the wavelength conversion adhesive layer 170 and extended to the side surface 116*c* of the light-emitting unit 110*c*, wherein the translucent adhesive layer 150*c* does not completely cover the side surface 116*c* of the light-emitting unit 110*c*, but is as shown in FIG. 14B in which the translucent adhesive layer 150*c* has a curvature inclined surface, and the thickness of the translucent adhesive layer 150*c* is greater toward the upper surface 112*c* of the light-emitting unit 110*c*, i.e., closer to the wavelength conversion adhesive layer 170. Here, the object of the translucent adhesive layer 150*c* is to fix the position of the light-emitting unit 110*c*.

It should be mentioned that, in other embodiments, referring to FIG. 14B', before the light-emitting units 110*c* arranged at intervals are disposed on the wavelength conversion adhesive layer 170, an uncured translucent adhesive layer 150*c*' for which the material contains a translucent adhesive layer can also be formed on the wavelength conversion adhesive layer 170. After the light-emitting units 110*c* are disposed on the wavelength conversion adhesive layer 170 at intervals, the translucent adhesive layer 150*c*' can be extended and disposed between the light-emitting unit 110*c* and the high-concentration fluorescent adhesive layer 172.

Figure 14C:
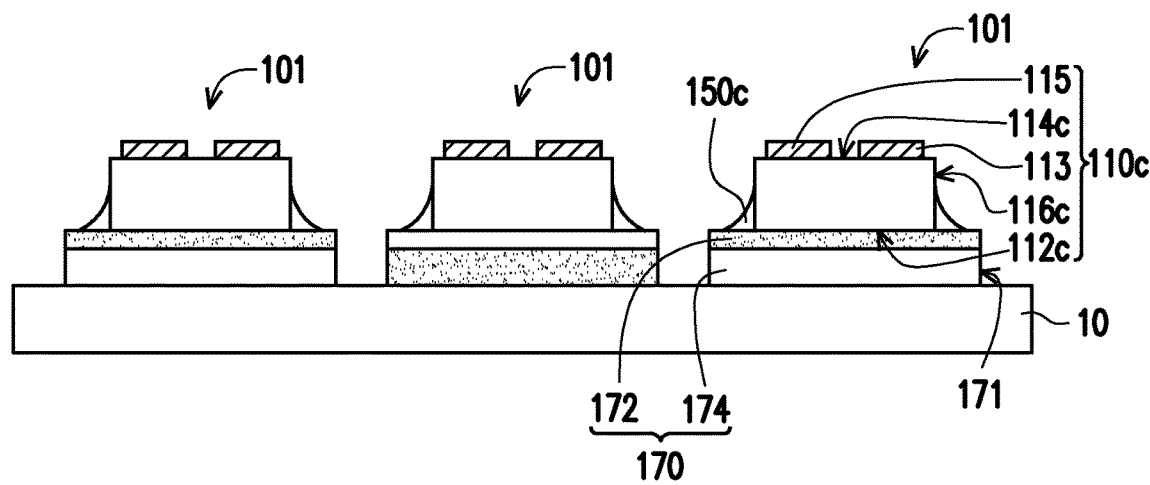

Next, referring to both the FIG. 14B and FIG. 14C, after the translucent adhesive layer 150*c*' is cured, a first cutting process is performed to cut the wavelength conversion adhesive layer 170 to form a plurality of units 101 separated from one another, wherein each of the units 101 respectively has at least one light-emitting unit 110*c* and a wavelength conversion adhesive layer 170 disposed on the upper surface 112*c* of the light-emitting units 110*c*, and edges 171 at two sides of the wavelength conversion adhesive layer 170 of each of the units 101 are extended outside the side surface 116*c* of the light-emitting units 110*c*. Next, referring further to FIG. 14C, the units 101 arranged at intervals are disposed on a substrate 10. In the present embodiment, the material of the substrate 10 is, for instance, stainless steel, ceramic, or other non-conductive materials, and is not particularly limited.

Figure 14D:
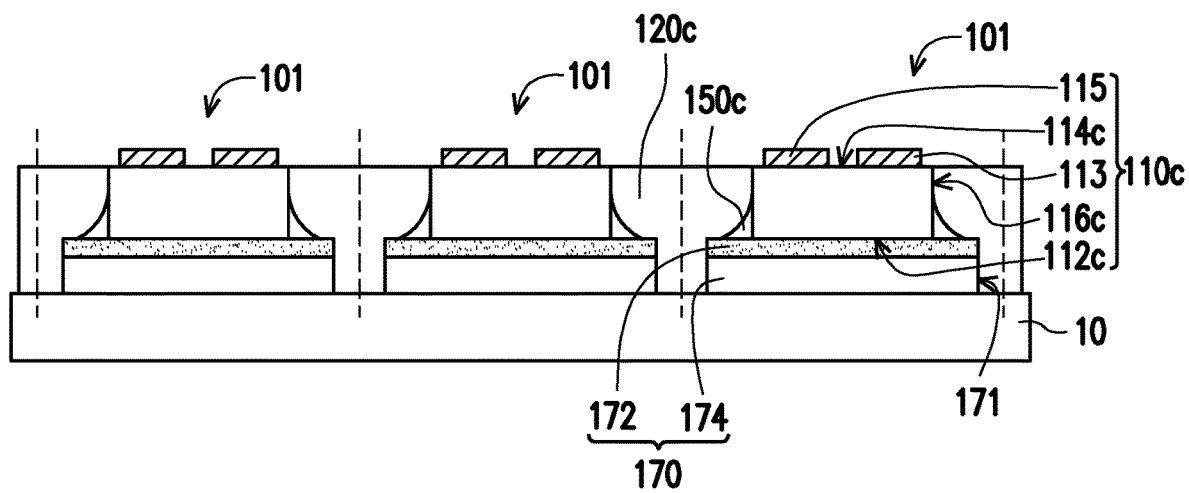

Next, referring to FIG. 14D, a reflective protecting element 120*c* is formed on the substrate 10 to cover the side surface 116*c* of the light-emitting units 110*c* of each of the units 101 and the edges 171 of the wavelength conversion adhesive layer 170. Here, the forming method of the reflective protecting element 120*c* is, for instance, dispensing, wherein the reflective protecting element 120*c* directly covers the translucent adhesive layer 150*c* and is extended along the translucent adhesive layer 150*c* to cover the edges 171 of the wavelength conversion adhesive layer 170. The orthographic projections of the first electrode pad 113 and the second electrode pad 115 of the light-emitting units 110*c* on the substrate 10 are not overlapped with the orthographic projection of the reflective protecting element 120*c* on the substrate 10. Here, the reflective protecting element 120*c* is, for instance, a white adhesive layer.

Figure 14E:
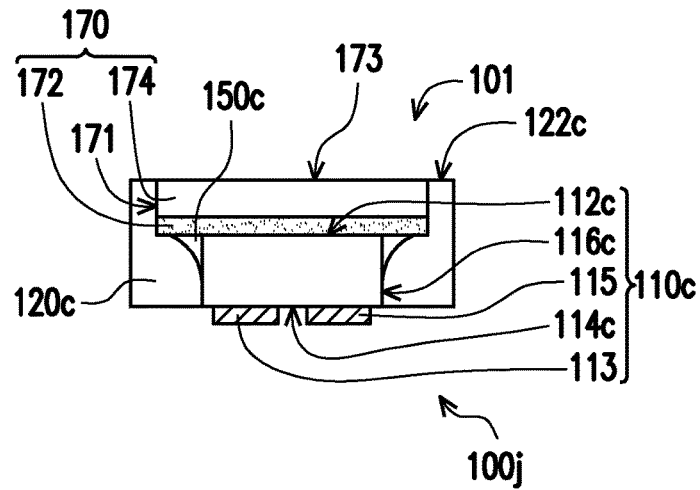

Lastly, referring to both FIG. 14D and FIG. 14E, a second cutting process is performed to cut the reflective protecting element 120*c* and remove the substrate 10 to form a plurality of light-emitting devices 100*j* separated from one another. Each of the light-emitting devices 100*j* respectively has at least one light-emitting unit 101 and a reflective protecting element 120*c* covering the side surface 116*c* of the light-emitting unit 110*c* and the edges 171 of the wavelength conversion adhesive layer 170. After the substrate 10 is removed, a top surface 122*c* of the reflective protecting element 120*c* of each of the light-emitting devices 100*j* and a top surface 173 of the wavelength conversion adhesive layer 170 are exposed. In another embodiment of the invention, the substrate 10 can also be removed first before a cutting process is performed. At this point, the manufacture of the light-emitting devices 100*j* is complete.

In terms of structure, referring further to FIG. 14E, the light-emitting device 100*j* of the present embodiment includes a light-emitting unit 110*c*, a reflective protecting element 120*c*, a translucent adhesive layer 150*c*, and a wavelength conversion adhesive layer 170. The wavelength conversion adhesive layer 170 is disposed on the upper surface 112*c* of the light-emitting unit 110*c*, wherein the wavelength conversion adhesive layer 170 includes a low-concentration fluorescent adhesive layer 174 and a high-concentration fluorescent adhesive layer 172, and the high-concentration fluorescent adhesive layer 172 is located between the low-concentration fluorescent adhesive layer 174 and the light-emitting unit 110c, and the edges 171 of the wavelength conversion adhesive layer 170 are extended outside the side surface 116c of the light-emitting unit 110c. Here, the low-concentration fluorescent adhesive layer 174 can be used as a transparent protective layer to increase the number of water vapor transmission paths to effectively block water vapor. The translucent adhesive layer 150c is disposed between the side surface 116c of the light-emitting unit 110c and the reflective protecting element 120c to fix the position of the light-emitting unit 110c. The reflective protecting element 120c of the present embodiment further covers the edges 171 of the wavelength conversion adhesive layer 170 along the translucent adhesive layer 150c covering the side surface 116c of the light-emitting unit 110c, and therefore the light-emitting device 100j of the present embodiment does not need a known bearing bracket to support and fix the light-emitting unit 110c, such that package thickness and manufacturing cost can be effectively reduced. At the same time, the positive optical efficiency of the light-emitting unit 110c can also be effectively increased via the reflective protecting element 120c having high reflectivity. Here, the top surface 122c of the reflective protecting element 120c is embodied as aligned with the top surface 173 of the wavelength conversion adhesive layer 170.

Figure 15A:
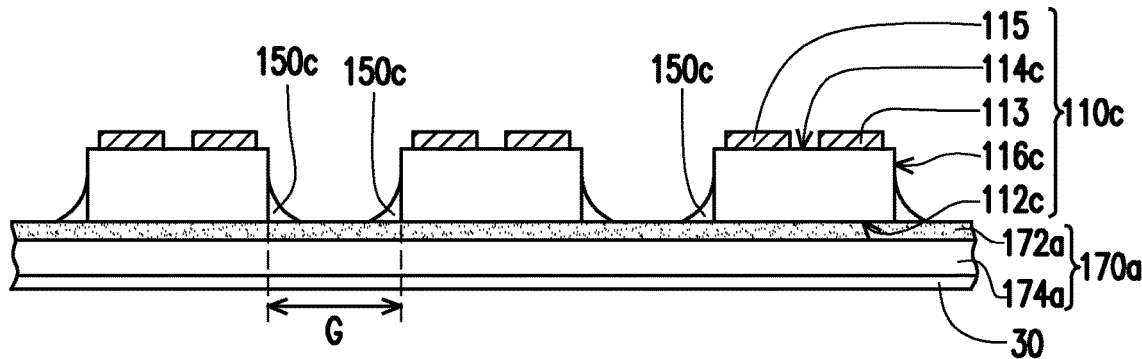
FIG. 15A to FIG. 15E show cross sections of a manufacturing method of a light-emitting device of another embodiment of the invention.

FIG. 15A to FIG. 15E show cross sections of a manufacturing method of a light-emitting device of another embodiment of the invention. Referring first to FIG. 15A, a first release film 30 is provided, and then a wavelength conversion adhesive layer 170a is provided on the first release film 30. The wavelength conversion adhesive layer 170a can be a single adhesive layer or a plurality of adhesive layers, and in the present embodiment, the wavelength conversion adhesive layer 170a includes a low-concentration fluorescent adhesive layer 174a and a high-concentration fluorescent adhesive layer 172a located on the low-concentration fluorescent adhesive layer 174a. Here, the steps of forming the wavelength conversion adhesive layer 170a include, for instance, first forming the wavelength conversion adhesive layer 170a in the manner of mixing a dopant and a colloid, and then leaving the wavelength conversion adhesive layer 170a to stand for a period of time, such as 24 hours, to form the low-concentration fluorescent adhesive layer 172a and the high-concentration fluorescent adhesive layer 174a separated from each other. Here, the first release film 30 is, for instance, a double-sided adhesive film.

Figure 15B:
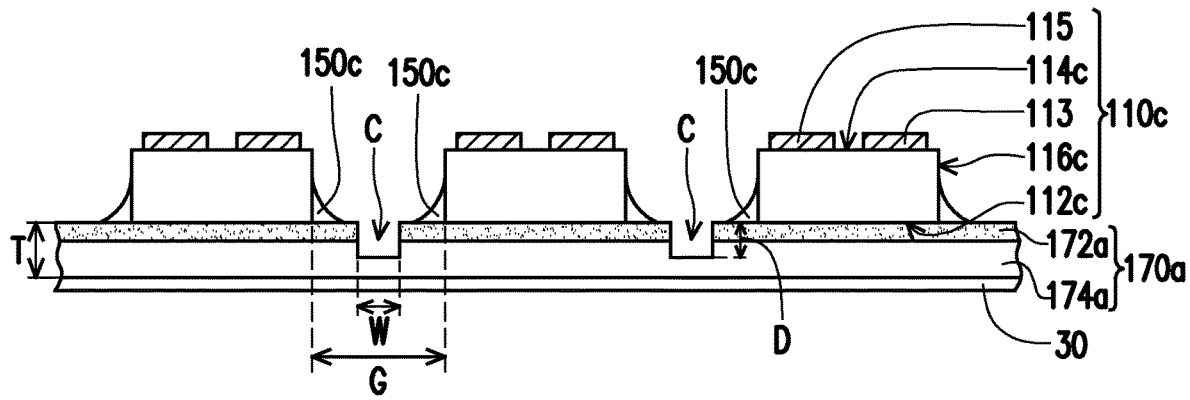

Next, referring further to FIG. 15A, a plurality of light-emitting units 110c arranged at intervals is disposed on the wavelength conversion adhesive layer 170A, wherein each of the light-emitting units 110c has an upper surface 112c and a lower surface 114c opposite to each other, a side surface 116c connected to the upper surface 112c and the lower surface 114c, and a first electrode pad 113 and a second electrode pad 115 located on the lower surface 114c and separated from each other, and the upper surface 112c of the light-emitting unit 110c is located on the high-concentration fluorescent adhesive layer 172a of the wavelength conversion adhesive layer 170a. Here, two adjacent light-emitting units 110c have a gap G, and the gap G is, for instance, 700 microns. Next, a plurality of translucent adhesive layers 150c is respectively formed on the side surface 116c of the light-emitting unit 110c, wherein the translucent adhesive layer 150c does not completely cover the side surface 116c of the light-emitting unit 110c, but is as shown in FIG. 15B in which the translucent adhesive layer 150c has a curvature inclined surface, and the thickness of the translucent adhesive layer 150c is greater toward the upper surface 112c of the light-emitting unit 110c. Here, the object of the translucent adhesive layer 150c is to fix the position of the light-emitting unit 110c.

Next, referring to FIG. 15B, a first cutting process is performed to cut the high-concentration fluorescent adhesive layer 172a and a portion of the low-concentration fluorescent adhesive layer 174a to form a plurality of trenches C. As shown in FIG. 15B, in the first cutting process, the wavelength conversion adhesive layer 170a is not completely cut off and only the high-concentration fluorescent adhesive layer 172 is cut off and a portion of the low-concentration fluorescent adhesive layer 174a is cut. Here, a width W of the trenches C is, for instance, 400 microns, and a depth D of the trenches C is, for instance, half of a thickness T of the wavelength conversion adhesive layer 170a. The thickness T of the wavelength conversion adhesive layer 170a is, for instance, 140 microns, and the depth D of the trenches C is, for instance, 70 microns. At this point, the position of the trenches C and the position of the packaging adhesive layer 150c do not interfere with each other.

Figure 15C:
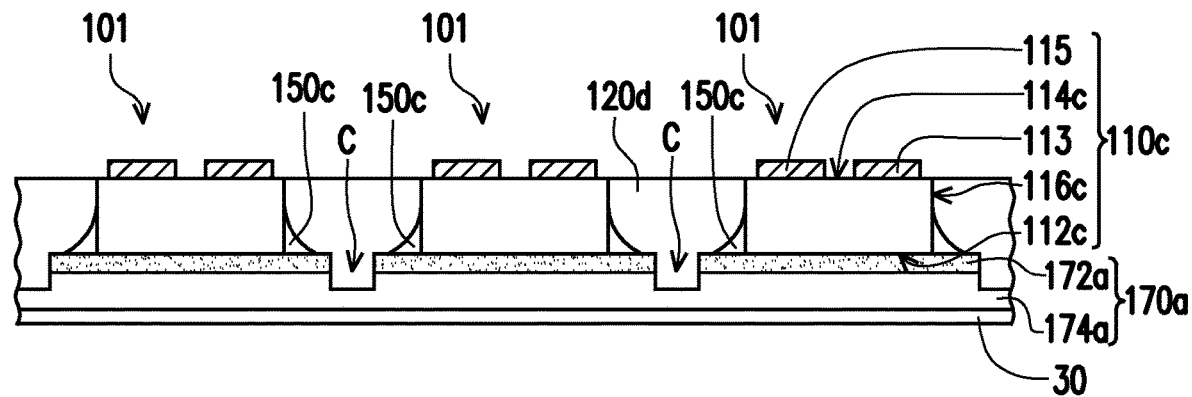

Next, referring to FIG. 15C, a reflective protecting element 120d is formed on the low-concentration fluorescent adhesive layer 174a to cover the side surface 116c of the light-emitting unit 110c, wherein the reflective protecting element 120d completely fills the trenches C and exposes the first electrode pad 113 and the second electrode pad 115 of the light-emitting unit 110c. Here, the reflective protecting element 120d is, for instance, a white adhesive layer.

Figure 15D:
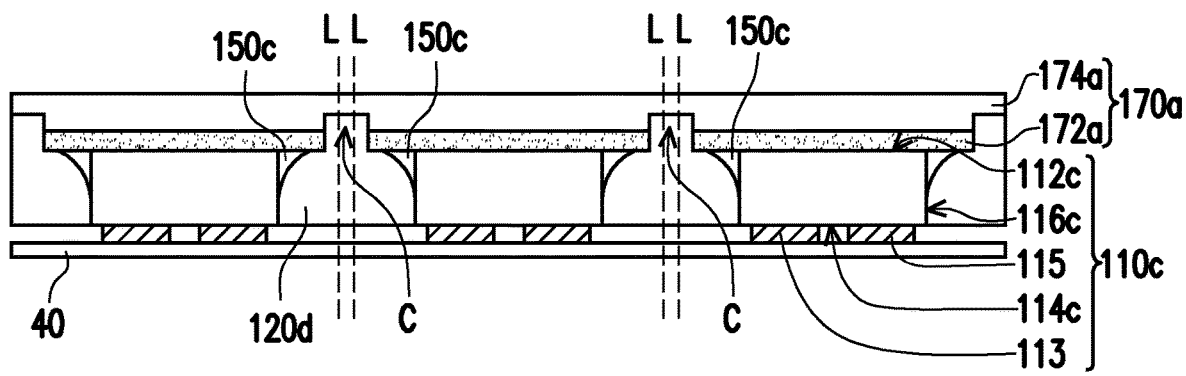
Figure 15E:
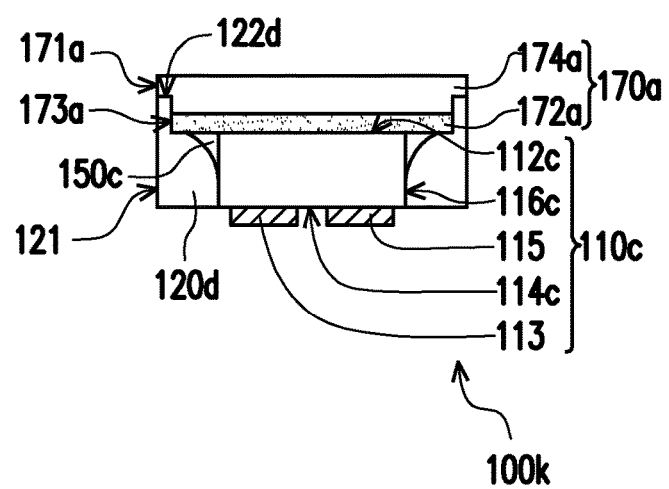

Lastly, referring to both FIG. 15D and FIG. 15E, the first release film 30 is removed and a second release film 40 is provided such that the first electrode pad 113 and the second electrode pad 115 of the light-emitting unit 110c are in contact with the second release film 40. Here, the second release film 40 is, for instance, a UV adhesive or double-sided adhesive. Next, a second cutting process is performed to cut the reflective protecting element 120d and the low-concentration fluorescent adhesive layer 174a along the extending direction of the trenches C (i.e., the extending direction of the cutting line L in FIG. 15D) to form a plurality of light-emitting devices 100k separated from one another. Each of the light-emitting devices 100k respectively has at least one light-emitting unit 110, a wavelength conversion adhesive layer 170a disposed on the upper surface 112c of the light-emitting unit 110c, and a reflective protecting element 120d covering the side surface 116c of the light-emitting unit 110c. In the present embodiment, the wavelength conversion adhesive layer 170a contains the high-concentration fluorescent adhesive layer 172a and the low-concentration fluorescent adhesive layer 174a. Here, edges 171a of the low-concentration fluorescent adhesive layer 174a of the wavelength conversion adhesive layer 170a are aligned with edges 121 of the reflective protecting element 120d, and the reflective protecting element 120d further covers edges 173a of the high-concentration fluorescent adhesive layer 172a. The second release film 40 is removed to complete the manufacture of the light-emitting device 100k.

In terms of structure, referring further to FIG. 15E, the light-emitting device 100k of the present embodiment includes a light-emitting unit 110c, a reflective protecting element 120d, a translucent adhesive layer 150c, and a wavelength conversion adhesive layer 170a. The wavelength conversion adhesive layer 170a is disposed on the upper surface 112c of the light-emitting unit 110c, wherein the wavelength conversion adhesive layer 170a includes a low-concentration fluorescent adhesive layer 174a and a high-concentration fluorescent adhesive layer 172a, the high-concentration fluorescent adhesive layer 172a is located between the low-concentration fluorescent adhesive layer 174a and the light-emitting unit 110c, and the edges 171a of the wavelength conversion adhesive layer 170a are extended outside the side surface 116c of the light-emitting unit 110c. Here, the low-concentration fluorescent adhesive layer 174 can be used as a transparent protective layer to increase the number of water vapor transmission paths to effectively block water vapor. The translucent adhesive layer 150c is disposed between the side surface 116c of the light-emitting unit 110c and the reflective protecting element 120d to fix the position of the light-emitting unit 110c. The reflective protecting element 120d of the present embodiment further covers the two edges 173a of the high-concentration fluorescent adhesive layer 172a of the wavelength conversion adhesive layer 170a along the translucent adhesive layer 150c covering the side surface 116c of the light-emitting unit 110c, and therefore the light-emitting device 100k of the present embodiment does not need a known bearing bracket to support and fix the light-emitting unit 110c, such that package thickness and manufacturing cost can be effectively reduced. At the same time, the positive optical efficiency of the light-emitting unit 110c can also be effectively increased via the reflective protecting element 120d having high reflectivity. Moreover, the low-concentration fluorescent adhesive layer 174a of the wavelength conversion adhesive layer 170a of the present embodiment covers a top surface 122d of the reflective protecting element 120d. In other words, the edges 173a of the high-concentration fluorescent adhesive layer 172a and the edges 171a of the low-concentration fluorescent adhesive layer 174a of the wavelength conversion adhesive layer 170a of the present embodiment are not aligned.

Figure 16A:
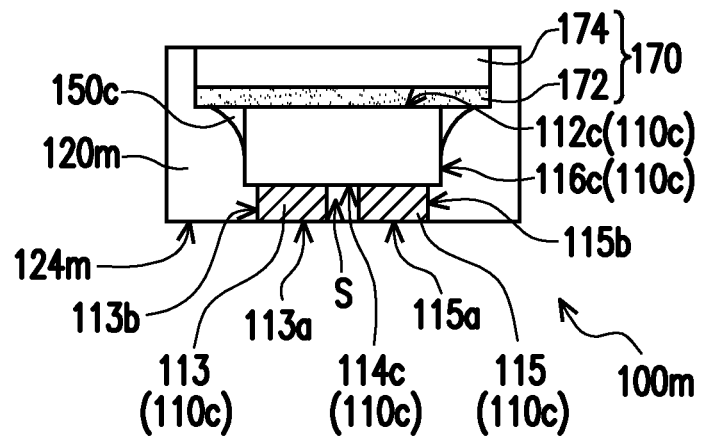
FIG. 16A to FIG. 16C show cross sections of a light-emitting device of a plurality of embodiments of the invention.

In other embodiments, referring to FIG. 16A, a light-emitting device 100m of the present embodiment is similar to the light-emitting device 100j in FIG. 14E, and the difference is that, a reflective protecting element 120m of the present embodiment completely fills a gap S between the first electrode pad 113 and the second electrode pad 114 and completely covers a first side surface 113b of the first electrode pad 113 and a second side surface 115b of the second electrode pad 115, and a bottom surface 124m of the reflective protecting element 120m is aligned with the first bottom surface 113a of the first electrode pad 113 and the second bottom surface 115a of the second electrode pad 115. As a result, light leakage to the bottom of the light-emitting device 100m can be prevented. Moreover, the reflective protecting element 120m completely covers the two edges of the wavelength conversion adhesive layer 170a. Moreover, since the coverage of the reflective protecting element 120m is good and the reflective protecting element 120m has better structural strength, the light-emitting device 100m of the present embodiment does not need a known bearing bracket to support and fix the light-emitting unit 110c, such that package thickness and manufacturing cost can be effectively reduced.

Figure 16B:
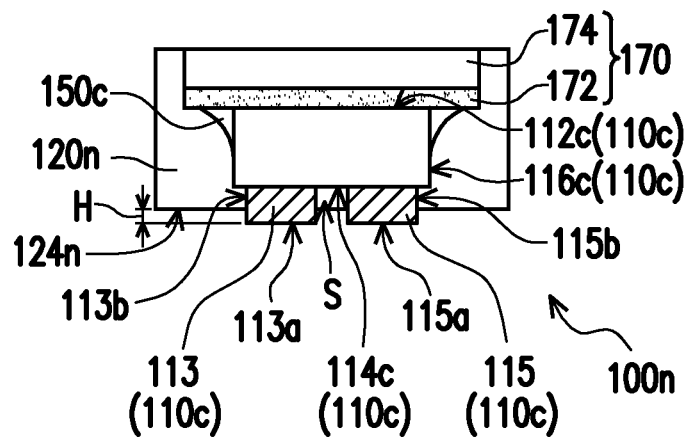
Figure 16C:
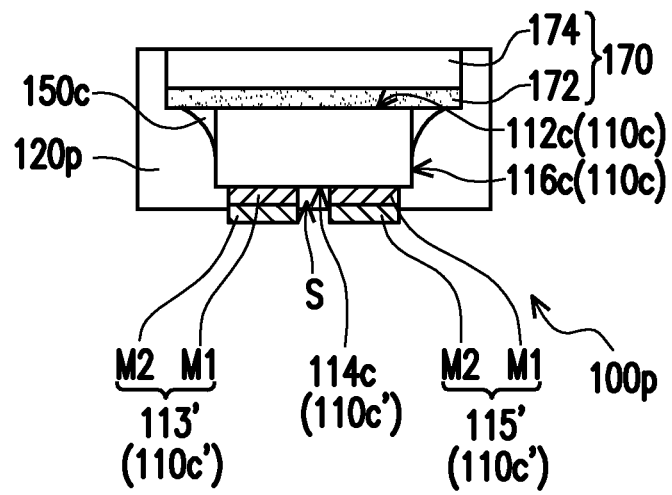

Alternatively, referring to FIG. 16B, a light-emitting device 100n of the present embodiment is similar to the light-emitting device 100k in FIG. 16A, and the difference is that, a reflective protecting element 120n of the present embodiment is filled in the gap S between the first electrode pad 113 and the second electrode pad 114 but does not completely fill the gap S, and the reflective protecting element 120n only covers a portion of the first side surface 113b of the first electrode pad 113 and a portion of the second side surface 115b of the second electrode pad 115. In other words, a height difference H exists between a bottom surface 124n of the reflective protecting element 120n and the first bottom surface 113a of the first electrode pad 113 and the second bottom surface 115a of the second electrode pad 115. Alternatively, referring to FIG. 16C, a light-emitting device 100p of the present embodiment is similar to the light-emitting device 100n in FIG. 16B, and the difference is that, a first electrode pad 113' and a second electrode pad 115' in the present embodiment are embodied as a plurality of metal layers, such as formed by a first metal layer M1 and a second metal layer M2, but are not limited thereto. A reflective protecting element 120p completely covers the side surface of the first metal layer M1 of the first electrode pad 113' and the second electrode pad 115 but does not completely cover the side surface of the second metal layer M2 of the first electrode pad 113' and the second electrode pad 115'. In short, the first electrode pads 113 and 113' and the second electrode pads 115 and 115' of the light-emitting units 110c and 110c' of the light-emitting devices 100m, 100n, and 100p can be a single metal layer or a plurality of metal layers and are not particularly limited.

FIG. 17A to FIG. 17E show cross sections of a manufacturing method of a light-emitting device of an embodiment of the invention. Regarding the manufacturing method of the light-emitting device of the present embodiment, first, referring to FIG. 17A, a wavelength conversion adhesive layer 210 is provided. The wavelength conversion adhesive layer 210 can be a single adhesive layer or a plurality of adhesive layers, and the wavelength conversion adhesive layer 210 in the present embodiment includes a low-concentration fluorescent adhesive layer 212 and a high-concentration fluorescent adhesive layer 214 located on the low-concentration fluorescent adhesive layer 212. Here, the steps of forming the wavelength conversion adhesive layer 210 include, for instance, first laying a wavelength conversion adhesive material layer (not shown) formed by evenly mixing a fluorescent power (not shown) and silicone (not shown) in the manner of mixing a dopant and a colloid on a release film (not shown), and then leaving the wavelength conversion adhesive material layer to stand for a period of time, such as 24 hours, and a wavelength conversion adhesive layer 210 having a low-concentration fluorescent adhesive layer 212 and a high-concentration fluorescent adhesive layer 214 separated from each other is formed due to the density difference between the fluorescent powder and the silicone, wherein the high-concentration fluorescent adhesive layer 214 is precipitated below the low-concentration fluorescent adhesive layer 212, the high-concentration fluorescent adhesive layer 214 is, for instance, yellow, the low-concentration fluorescent adhesive layer 212 is, for instance, transparent, the thickness of the low-concentration fluorescent adhesive layer 212 is preferably greater than the thickness of the high-concentration fluorescent adhesive layer 214, and in an embodiment, the ratio of the thicknesses can be between 1 and 200, but is not limited thereto.

Next, referring further to FIG. 17A, a double-sided adhesive film 10a is provided. The low-concentration fluorescent adhesive layer 212 of the wavelength conversion adhesive layer 210 is disposed on the double-sided adhesive film 10a to fix the position of the wavelength conversion adhesive layer 210 via the double-sided adhesive film 10a. Next, a first cutting process is performed to cut from the high-concentration fluorescent adhesive layer 214 to a portion of the low-concentration fluorescent adhesive layer 212 to form a plurality of trenches C1. Here, the depth of each of the trenches C1 is at least half of the thickness of the wavelength conversion adhesive layer 210. For instance, if the thickness of the wavelength conversion adhesive layer 210 is 240 microns, then the depth of the trenches C1 is, for instance, 200 microns. At this point, the trenches C1 can divide the low-concentration fluorescent adhesive layer 212 of the wavelength conversion adhesive layer 210 into a mesa portion 212a and a protruding portion 212b located on the mesa portion 212a, and the high-concentration fluorescent adhesive layer 214 is located on the protruding portion 212b.

Next, referring to FIG. 17B, a plurality of light-emitting units 220 arranged at intervals is disposed on the wavelength conversion adhesive layer 210, wherein each of the light-emitting units 220 has an upper surface 222 and a lower surface 224 opposite to each other, a side surface 226 connected to the upper surface 222 and the lower surface 224, and a first electrode pad 223 and a second electrode pad 225 located on the lower surface 224 and separated from each other. The upper surface 222 of the light-emitting unit 220 is located on the high-concentration fluorescent adhesive layer 214 of the wavelength conversion adhesive layer 210 to increase light extraction rate and improve light type. The trenches C1 divide the light-emitting unit 220 into a plurality of units A, and each of the units A in the present embodiment at least includes two light-emitting units 220 (FIG. 17B schematically shows two light-emitting units 220). Each of the light-emitting units 220 is, for instance, an LED chip having an emission wavelength between 315 nm and 780 nm, and the LED chip includes, but is not limited to, a UV, blue, green, yellow, orange, or red LED chip.

Next, referring further to FIG. 17B, a translucent adhesive layer 230a is formed on the wavelength conversion adhesive layer 210 and extended and disposed on the side surface 226 of the light-emitting unit 220. As shown in FIG. 17B, the thickness of the translucent adhesive layer 230a is gradually increased from the lower surface 224 toward the upper surface 222 of each of the light-emitting units 220, and the translucent adhesive layer 230a has a concave surface 232 relative to the side surface 226 of the light-emitting unit 220, but is not limited thereto. Here, the object of the translucent adhesive layer 230a is to fix the position of the light-emitting units 220, and since the translucent adhesive layer 230a is a translucent material and has an index of refraction greater than 1, the light extraction effect of the side of the chip can also be increased.

Next referring to FIG. 17C, a reflective protecting element 240 is formed between the light-emitting units 220 and completely fills the trenches C1, wherein the reflective protecting element 240 is formed on the wavelength conversion adhesive layer 210 and covers each of the units A and completely fills the trenches C1. The reflective protecting element 240 exposes the lower surface 224, the first electrode pad 223, and the second electrode pad 225 of each of the light-emitting units 220. Here, the index of refraction of the reflective protecting element 240 is at least greater than 90%, and the reflective protecting element 240 is, for instance, a white adhesive layer. The forming method of the reflective protecting element 240 is, for instance, dispensing, wherein the reflective protecting element 240 directly covers the translucent adhesive layer 230a and is extended to cover the edges of the high-concentration fluorescent adhesive layer 214 along the translucent adhesive layer 230a and completely fills the trenches C1. At this point, the orthographic projections of the first electrode pad 223 and the second electrode pad 225 of the light-emitting units 220 on the double-sided adhesive film 10a are not overlapped with the orthographic projection of the reflective protecting element 240 on the double-sided adhesive film 10a.

Next, referring further to FIG. 17C, a second cutting process is performed from the reflective protecting element 240 along the trenches C1 through the low-concentration fluorescent adhesive layer 212 to form a plurality of light-emitting devices 200a separated from one another. At this point, as shown in FIG. 17C, the wavelength conversion adhesive layer 210 in contact with two light-emitting units 220 in each of the units A is continuous. That is, the light-emitting units 220 have the same light-emitting surface, and therefore the light emitted by the light-emitting units 220 can be guided by the transparent low-concentration fluorescent adhesive layer 212 such that the light-emitting devices 200a of the present embodiment have better luminance uniformity.

Figure 17D:
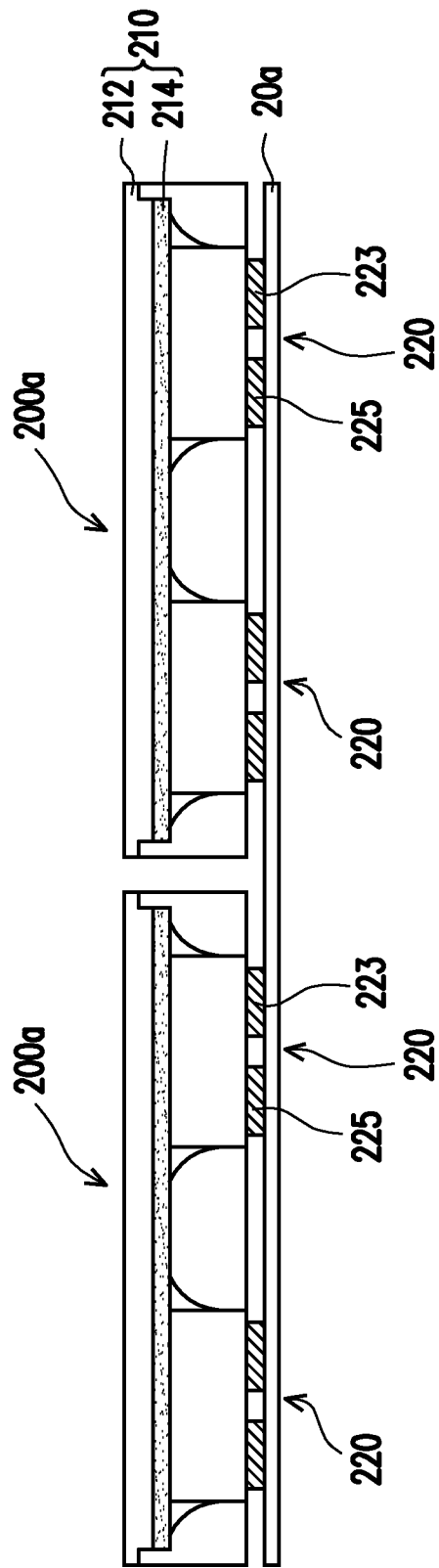

Next, referring to both FIG. 17C and FIG. 17D, after a second cutting process is performed, a film-turning process is needed. First, a UV adhesive film 20a is provided on the first electrode pad 223 and the second electrode pad 225 of the light-emitting units 220 to first fix the relative positions of the light-emitting devices 200a. Next, the double-sided adhesive film 10a is removed to expose the low-concentration fluorescent adhesive layer 212 of the wavelength conversion adhesive layer 210. Lastly, referring to FIG. 17E, the UV adhesive film 20a is removed to expose the first electrode pad 223 and the second electrode pad 225 of the light-emitting units 220. At this point, the manufacture of the light-emitting devices 200a is complete. It should be mentioned that, for ease of explanation, FIG. 17E only schematically shows one light-emitting device 200a.

Figure 17E:
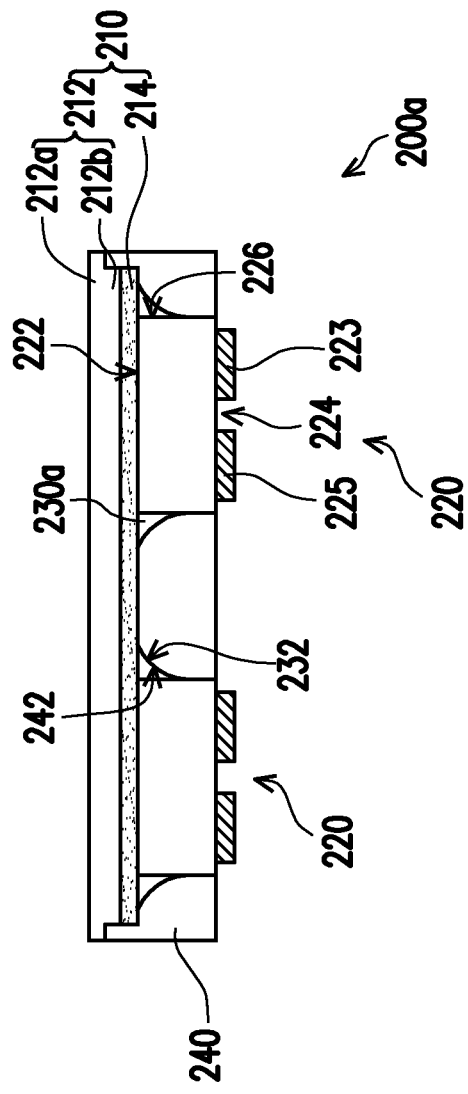

In terms of structure, referring further to FIG. 17E, the light-emitting device 200a includes a plurality of light-emitting units 220 (FIG. 17E schematically shows two light-emitting units 220), a wavelength conversion adhesive layer 210, and a reflective protecting element 240. Each of the light-emitting units 220 has an upper surface 222 and a lower surface 224 opposite to each other, a side surface 226 connected to the upper surface 222 and the lower surface 224, and a first electrode pad 223 and a second electrode pad 225 located on the lower surface 224 and separated from each other. The wavelength conversion adhesive layer 210 is disposed on the upper surface 222 of the light-emitting unit 220, and the wavelength conversion adhesive layer 210 includes a low-concentration fluorescent adhesive layer 212 and a high-concentration fluorescent adhesive layer 214. The low-concentration fluorescent adhesive layer 212 has a mesa portion 212a and a protruding portion 212b located on the mesa portion 212a. The high-concentration fluorescent adhesive layer 214 is disposed between the upper surface 222 and the protruding portion 212b, wherein the high-concentration fluorescent adhesive layer 214 covers the protruding portion 212b and is in contact with the upper surface 222 of the light-emitting unit 220. The light-emitting units 220 are arranged at intervals and expose a portion of the wavelength conversion adhesive layer 210. The reflective protecting element 240 covers the side surface 226 of each of the light-emitting units 220 and covers the wavelength conversion adhesive layer 210 exposed by the light-emitting units 220. The reflective protecting element 240 exposes the lower surface 224, the first electrode pad 223, and the second electrode pad 225 of each of the light-emitting units 220. The edges of the reflective protecting element 240 are aligned with the edges of the mesa portion 212a of the low-concentration fluorescent adhesive layer 212.

The light-emitting units 220 in the light-emitting device 200a of the present embodiment are only in contact with one wavelength conversion adhesive layer 210, i.e., the light-emitting units 220 have the same luminous surface, and the edges of the low-concentration fluorescent adhesive layer 212 are aligned with the edges of the reflective protecting element 240. Therefore, the light emitted by the light-emitting units 220 is guided by the low-concentration fluorescent adhesive layer 212 such that the light-emitting device 200a of the present embodiment can have a greater luminous area and better luminance uniformity. Moreover, the reflective protecting element 240 covers the side surface 226 of the light-emitting units 220, and the reflective protecting element 240 exposes the first electrode pad 223 and the second electrode pad 225 of the light-emitting units 220. Therefore, the light-emitting device 200a of the present embodiment does not need a known bearing bracket to support and fix the light-emitting units 220, such that package thickness and manufacturing cost can be effectively reduced. At the same time, the positive optical efficiency of the light-emitting units 220 can also be effectively increased.

It should be mentioned that, in the present embodiment, the structural type of the translucent adhesive layer 230a is not limited, even though the translucent adhesive layer 230a shown in FIG. 17E is embodied as having a concave surface 232 relative to the side surface 226 of the light-emitting units 220. In other words, the reflective protecting element 240 further contains a reflective surface 242 in contact with the light-emitting units 220, and the reflecting surface 242 is embodied as a curved surface. However, in other embodiments, referring to FIG. 18A, a light-emitting device 200b of the present embodiment is similar to the light-emitting device 200a in FIG. 17E, and the difference is that, a translucent adhesive layer 230b has a convex surface 234 relative to the side surface 226 of each of the light-emitting units 220 to effectively increase the lateral emission of the light-emitting units 220. Moreover, with the configuration of the wavelength conversion adhesive layer 210, the emission area of the light-emitting device 200b can also be increased. In other words, a reflective surface 242a of the reflective protecting element 240a is embodied as a curved surface. Alternatively, referring to FIG. 18B, a light-emitting device 200c of the present embodiment is similar to the light-emitting device 200a in FIG. 17E, and the difference is that, a translucent adhesive layer 230c has an inclined surface 236 relative to the side surface 226 of each of the light-emitting units 220. In other words, a reflective surface 242b of a reflective protecting element 240b is embodied as a flat surface.

It should be mentioned here that, the following embodiments adopt the reference numerals of the embodiments above and a portion of the contents thereof, wherein the same reference numerals are adopted to represent the same or similar elements. Descriptions of the same technical content are as provided in the embodiments above and are not repeated in the following embodiments.

Figure 19C:
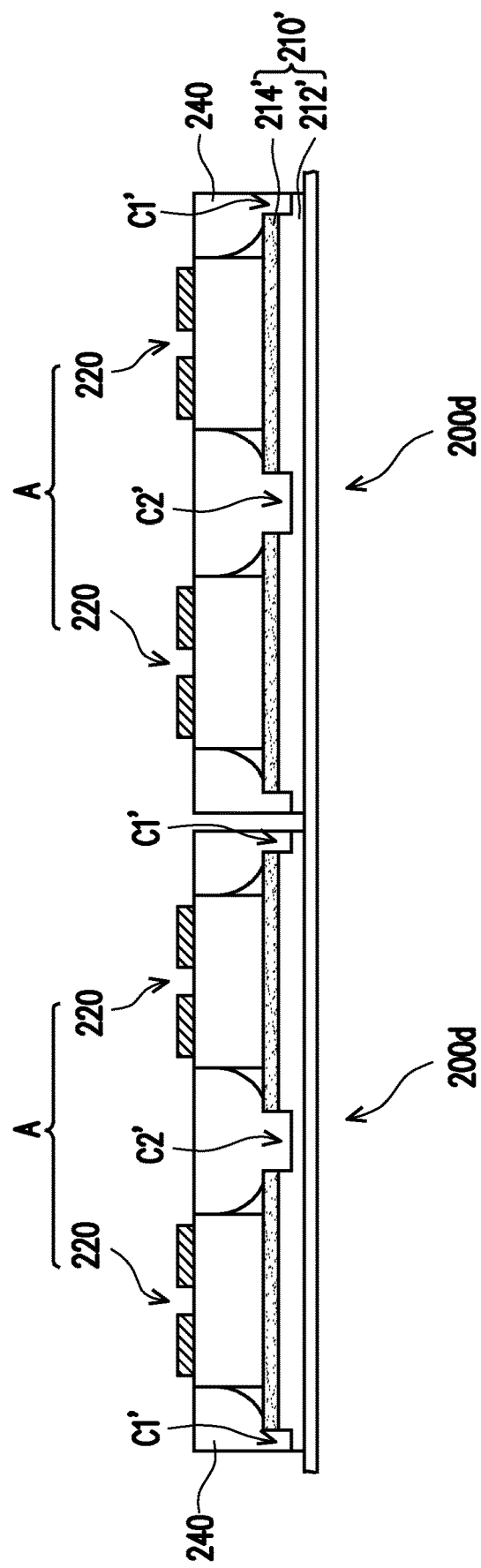
Figure 19D:
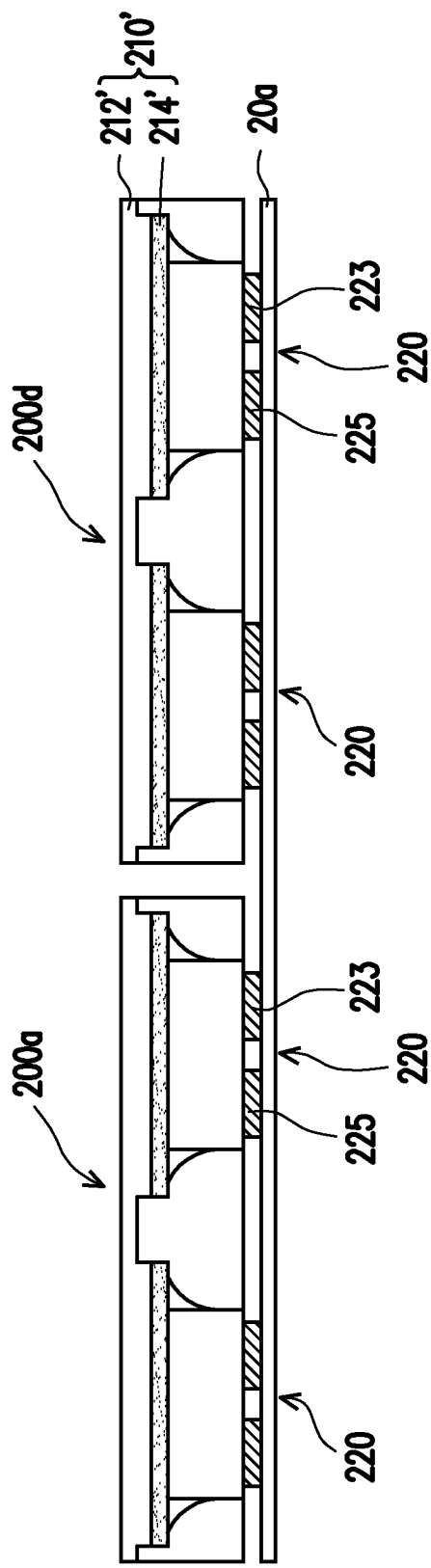

FIG. 19A to FIG. 19E show cross sections of a manufacturing method of a light-emitting device of another embodiment of the invention. The main difference between the manufacturing method of a light-emitting device 200d of the present embodiment and the manufacturing method of the light-emitting device 200a in FIG. 17A to FIG. 17E is that, referring to FIG. 19A, during the first cutting process, a plurality of second trenches C2' cut from a high-concentration fluorescent adhesive layer 214' to a portion of a low-concentration fluorescent adhesive layer 212' is further formed. As shown in FIG. 19A, the positions of the trenches C1' and the second trenches C2' are alternately arranged, wherein the depth of each of the trenches C1' is at least half of the thickness of the wavelength conversion adhesive layer 210', and the depth of each of the second trenches C2' is the same as the depth of each of the trenches C1'. For instance, the thickness of the wavelength conversion adhesive layer 210' is 240 microns and the depth of the trenches C1' and the depth of the second trenches C2' are, for instance, 200 microns, but are not limited thereto. At this point, a mesa portion 212a' of the low-concentration fluorescent adhesive layer 212' has a thickness T, and preferably, the thickness T is, for instance, between 20 microns and 50 microns. The second trenches C2' divide the protruding portion of the low-concentration fluorescent adhesive layer 212' in the wavelength conversion adhesive layer 210' into two protruding sub-portions 212b', and the high-concentration fluorescent adhesive layer 214' is located on the protruding sub-portions 212b'.

Next, referring to FIG. 19B, the light-emitting units 220 arranged at intervals are disposed on the wavelength conversion adhesive layer 210', wherein the second trenches C2' are located between two light-emitting units 220 of each of the light-emitting units A, the light-emitting units 220 are respectively disposed on the protruding sub-portions 212b', and the upper surface 222 of the light-emitting units 220 is in direct contact with the high-concentration fluorescent adhesive layer 214'. Preferably, the ratio of the length of each of the protruding sub-portions 212b' and the length of the corresponding light-emitting unit 220 is greater than 1 and less than 1.35. In other words, the edges of the protruding sub-portions 212b' of the low-concentration fluorescent adhesive layer 212' are outside the edges of the light-emitting units 220, and the edges of the high-concentration fluorescent adhesive layer 214' are also extended outside the edges of the light-emitting units 220 to effectively increase the luminous area of the light-emitting units 220. Next, a translucent adhesive layer 230a is respectively formed on the side surface 226 of the light-emitting units 220, wherein the translucent adhesive layer 226 is only disposed on the side surface 226 of the light-emitting units 220 and extended onto the high-concentration fluorescent adhesive layer 214' of the wavelength conversion adhesive layer 210' and is not extended and disposed on the low-concentration fluorescent adhesive layer 212'.

Next, similar to the steps of FIG. 17C, FIG. 17D, and FIG. 17E, referring first to FIG. 19C, a reflective protecting element 240 is formed on the wavelength conversion adhesive layer 210' to cover each of the units A and completely fill the trenches C1' and the second trenches C2'. Next, a second cutting process is performed from the reflective protecting element 240 along the trenches C1' through the low-concentration fluorescent adhesive layer 212' to form a plurality of light-emitting devices 200d separated from one another. Next, referring to both FIG. 19C and FIG. 19D, after a second cutting process is performed, a film-turning process is needed. First, a UV adhesive film 20a is provided on the first electrode pad 223 and the second electrode pad 225 of the light-emitting units 220 to first fix the relative positions of the light-emitting devices 200a. Next, the double-sided adhesive film 10a is removed to expose the low-concentration fluorescent adhesive layer 212' of the wavelength conversion adhesive layer 210'. Lastly, referring to FIG. 19E, the UV adhesive film 20a is removed to expose the first electrode pad 223 and the second electrode pad 225 of the light-emitting units 220. At this point, the manufacture of the light-emitting devices 200d is complete. It should be mentioned that, for ease of explanation, FIG. 19E only schematically shows one light-emitting device 200d.

Figure 19E:
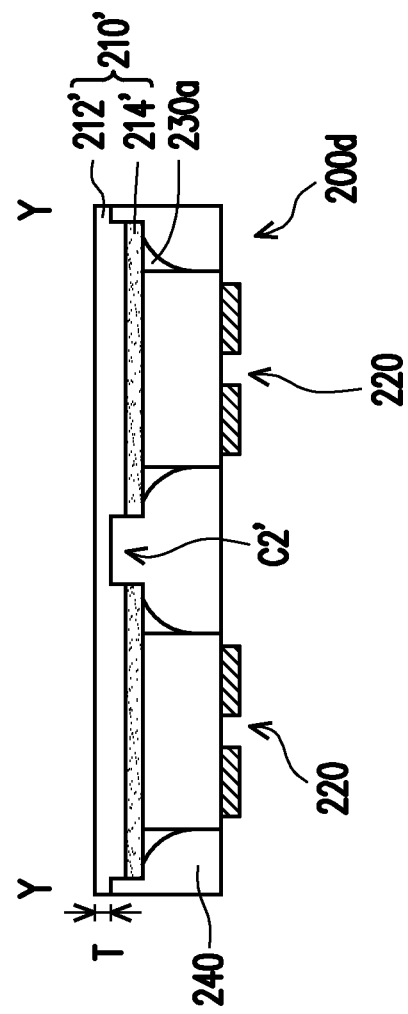
Figure 20A:
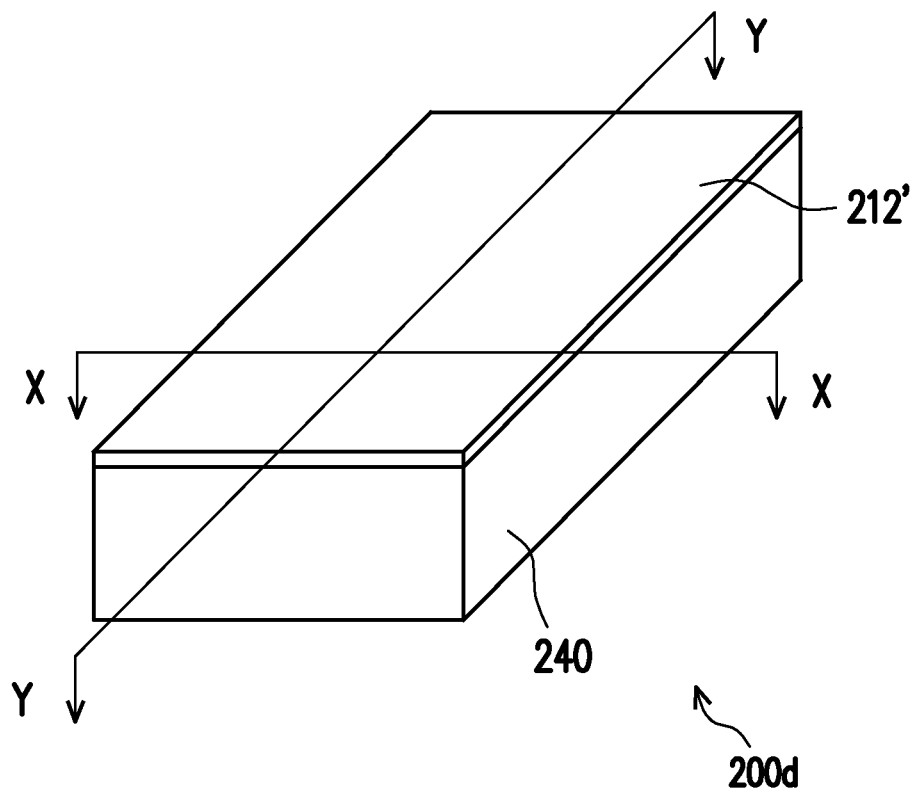
FIG. 20A shows a 3D view of the light-emitting device of FIG. 19E.
Figure 20B:
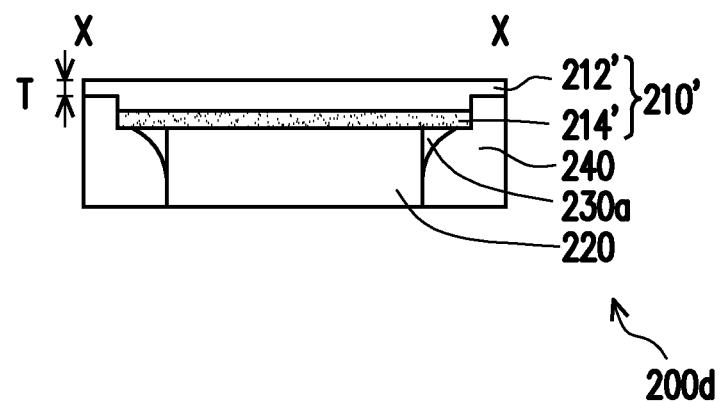
FIG. 20B shows a cross section along line X-X of FIG. 20A.

Referring to all of FIG. 19E, FIG. 20A, and FIG. 20B, it should be mentioned that, FIG. 19E shows a cross section along line Y-Y in FIG. 20A. The light-emitting device 200d of the present embodiment is similar to the light-emitting device 200a in FIG. 17E, and the difference is that, the wavelength conversion adhesive layer 210' exposed between two light-emitting units 220 further has the second trenches C2', wherein the second trenches C2' are extended from the high-concentration fluorescent adhesive layer 214' to a portion of the low-concentration fluorescent adhesive layer 212'. In other words, two light-emitting units 220 are disposed on one continuous wavelength conversion adhesive layer 210', and therefore the light-emitting units 220 have the same light-emitting surface, and the edges of the low-concentration fluorescent adhesive layer 212' are aligned with the edges of the reflective protecting element 240. Therefore, the light emitted by the light-emitting units 220 is guided by the low-concentration fluorescent adhesive layer 212' such that the light-emitting device 200d of the present embodiment can have a greater luminous area and better luminance uniformity.

In particular, during the first cutting process, the depths cut along line X-X and line Y-Y in FIG. 20A are substantially the same. In other words, referring to FIG. 20B, in the cross section of line X-X, the mesa portion 212a' of the low-concentration fluorescent adhesive layer 212' has a thickness T, and referring to FIG. 19E, in the cross section of line Y-Y, the mesa portion 212a' of the low-concentration fluorescent adhesive layer 212' also has the thickness T. Preferably, the thickness T is, for instance, between 20 microns and 50 microns.

Figure 21A:
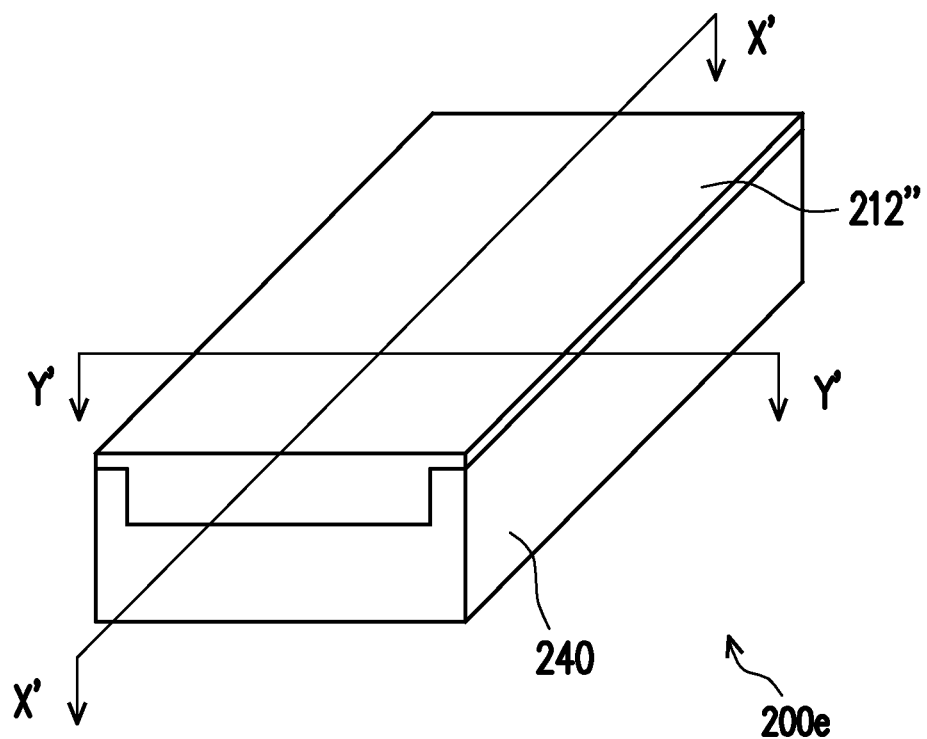
FIG. 21A shows a 3D view of a light-emitting device of another embodiment of the invention.
Figure 21B:
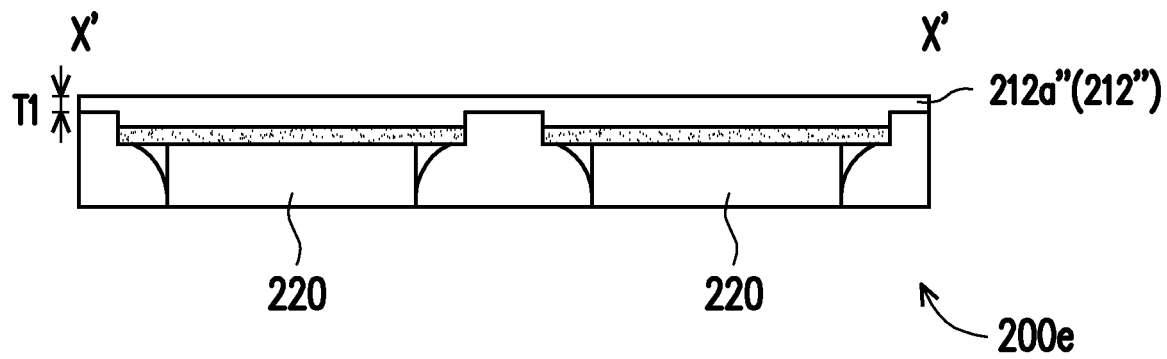
FIG. 21B and FIG. 21C respectively show cross sections along line X'-X' and line Y'-Y' of FIG. 21A.
Figure 21C:
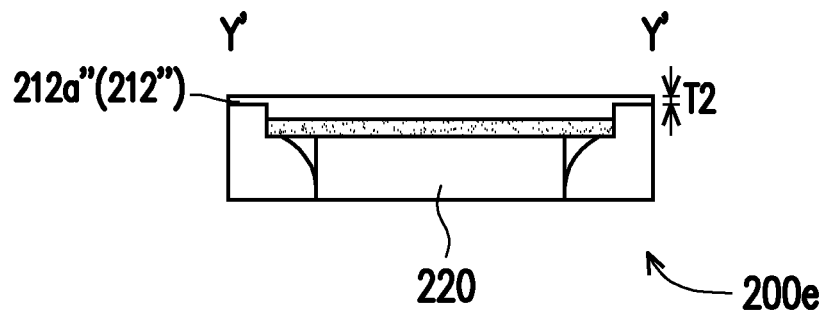

Of course, in other embodiments, during the first cutting process, when cutting in different directions, the mesa portion 212a' of the low-concentration fluorescent adhesive layer 212' can also have a different thickness. FIG. 21A shows a 3D view of a light-emitting device of another embodiment of the invention. FIG. 21B and FIG. 21C respectively show cross sections along line X'-X' and line Y'-Y' of FIG. 21A. Referring to all of FIG. 21A, FIG. 21B, and FIG. 21C, during the first cutting process, the depths cut along line X'-X' and line Y'-Y' in FIG. 21A are different, such that the wavelength conversion adhesive layer 210' further includes a first exposed side portion and a second exposed side portion not covered by the reflective protecting element 240. The first exposed side portion and the second exposed side portion are not parallel, and the thickness of the wavelength conversion adhesive layer 210' at the first exposed side portion is different from the thickness of the wavelength conversion adhesive layer 210' at the second exposed side portion. Specifically, a mesa portion 212a" of a low-concentration fluorescent adhesive layer 212" has a first thickness T1 along line X'-X', the mesa portion 212a" of the low-concentration fluorescent adhesive layer 212" has a second thickness T2 along line Y'-Y', and the first thickness T1 is different from the second thickness T2. Preferably, the first thickness T1 is, for instance, between 50 microns and 200 microns, and the second thickness T2 is, for instance, between 20 microns and 50 microns.

Since the mesa portion 212a" of the low-concentration fluorescent adhesive layer 212" of the present embodiment respectively has the first thickness T1 and the second thickness T2 different from each other along line X'-X' and line Y'-Y', the occurrence of reduced brightness caused by dark bands between two adjacent light-emitting units 220 can be effectively reduced to increase the luminance uniformity of the light-emitting device 200e. Moreover, it should be mentioned that, using line Y'-Y' as an example, when the thickness T2 of the mesa portion 212a" of a low-concentration fluorescent adhesive layer 212''' is increased from, for instance, 0.04 mm to 0.2 mm, the light-emitting angle of the light-emitting units 220 can also be increased from the original 120 degrees to 130 degrees, i.e., the light-emitting angle of the light-emitting units 220 can be increased by 10 degrees. In short, the thickness of the mesa portion 212a" of the low-concentration fluorescent adhesive layer 212''' is positively correlated to the light-emitting angle of the light-emitting units 220.

FIG. 22A to FIG. 22J show cross sections of a manufacturing method of a light-emitting device of another embodiment of the invention. FIG. 23 shows a comparison chart of color temperature of the light-emitting device of the embodiment of FIG. 22J and a known LED structure measured at different angles.

Referring to FIG. 22A, a first release film 30 is provided. The first release film 30 is, for instance, a double-sided adhesive film. Next, a wavelength conversion adhesive layer 170b is provided on the first release film 30. The wavelength conversion adhesive layer 170b can be a single adhesive layer or a plurality of adhesive layers, and in the present embodiment, the wavelength conversion adhesive layer 170b includes a low-concentration fluorescent adhesive layer 174b and a high-concentration fluorescent adhesive layer 172b located on the low-concentration fluorescent adhesive layer 174b. Here, the steps of forming the wavelength conversion adhesive layer 170b include, for instance, first forming the wavelength conversion adhesive layer 170b in the manner of mixing a dopant and a colloid, and then leaving the wavelength conversion adhesive layer 170b to stand for a period of time, such as 24 hours, to form the low-concentration fluorescent adhesive layer 174b and the high-concentration fluorescent adhesive layer 172b separated from each other. Moreover, the wavelength conversion adhesive layer 170b is heated and baked to cure and mold the low-concentration fluorescent adhesive layer 174b and the high-concentration fluorescent adhesive layer 172b.

Referring to FIG. 22B, a plurality of light-emitting units 110e (three in this case, but not limited thereto) is provided, wherein each of the light-emitting units 110e has an upper surface 112e and a lower surface 114e opposite to each other, a side surface 116e connected to the upper surface 112e and the lower surface 114e, and a first electrode pad 113 and a second electrode pad 115 located on the lower surface 114e and separated from each other. The width of each of the light-emitting units 110e is $W_E$. The light-emitting units 110e are, for instance, LED structures.

Figure 22D:
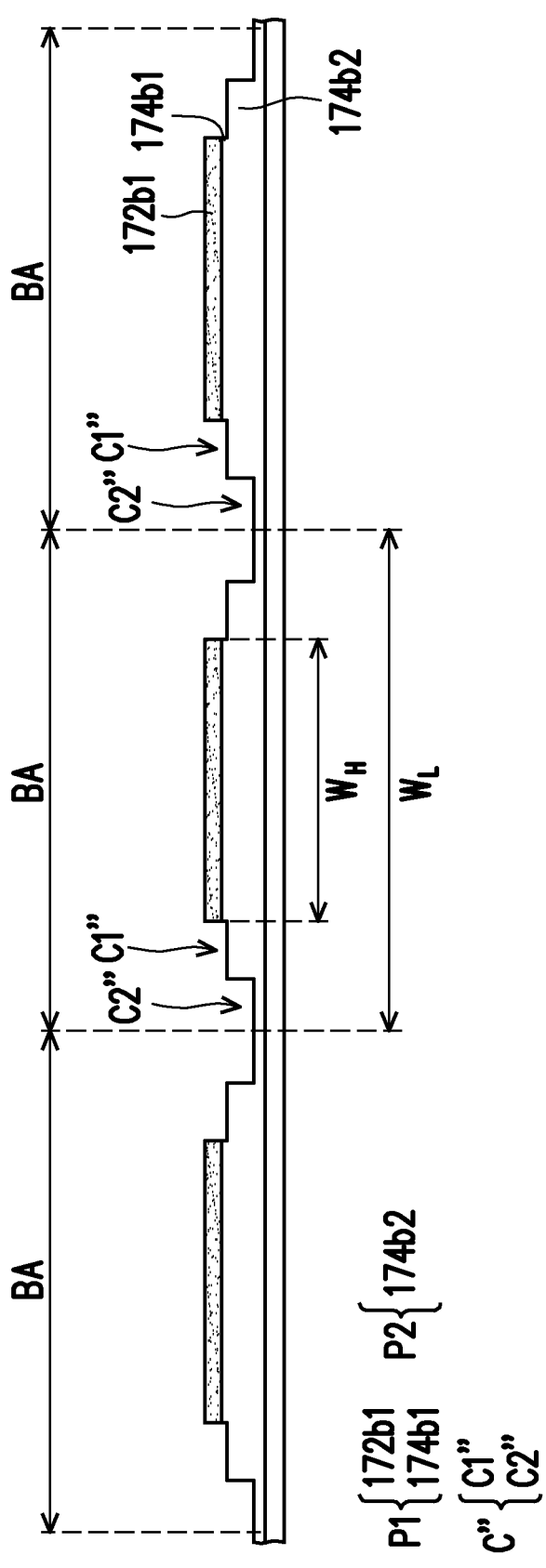
Figure 23:
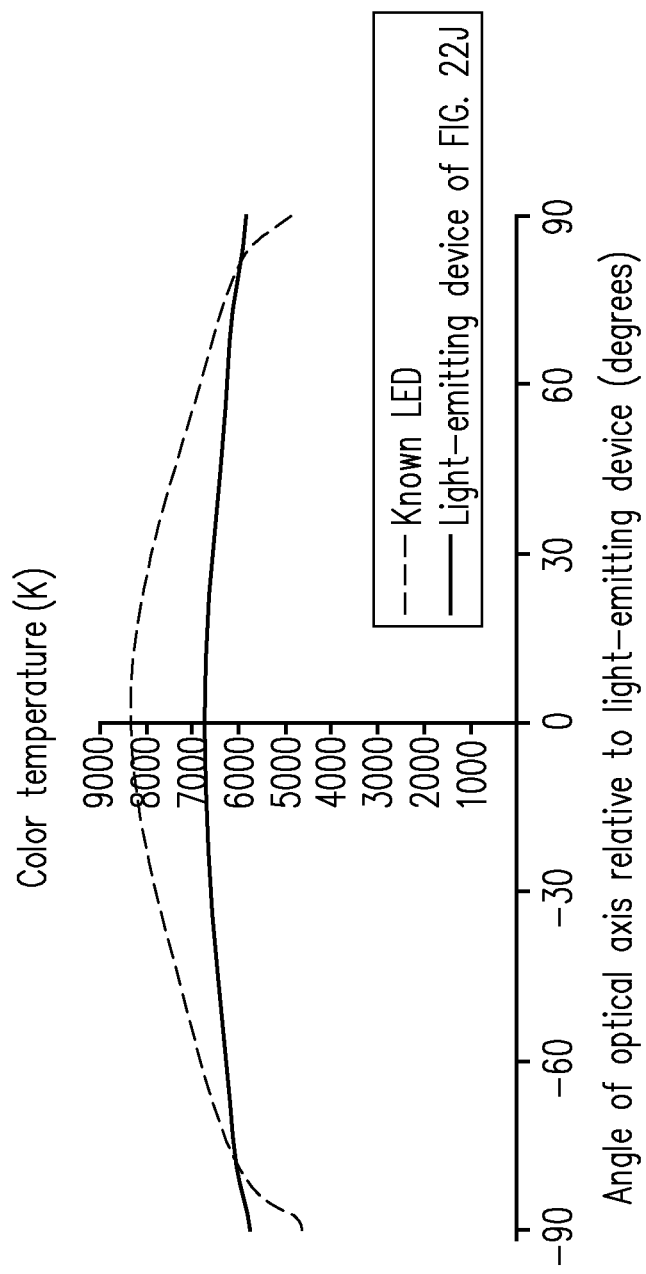
FIG. 23 shows a comparison chart of color temperature of the light-emitting device of the embodiment of FIG. 22J and a known light-emitting device measured at different angles.

Referring to FIG. 22C and FIG. 22D, a plurality of trenches C" is formed in the wavelength conversion adhesive layer 170b to define a plurality of bonding regions BA between the trenches C". Referring first to FIG. 22C, first, a portion of the high-concentration fluorescent adhesive layer 172b and a portion of the low-concentration fluorescent adhesive layer 174b in the wavelength conversion adhesive layer 170b are removed to form a plurality of first sub-trenches C1". The first sub-trenches C1" respectively form a plurality of first mesa portions P1 in the bonding regions BA. Each of the first mesa portions P1 further includes a first portion 172b1 of the high-concentration fluorescent adhesive layer 172b and a first portion 174b1 of the low-concentration fluorescent adhesive layer 174b. The first portion 172b1 of the high-concentration fluorescent adhesive layer 172b is disposed on the first portion 174b of the low-concentration fluorescent adhesive layer 174b. Next, referring to FIG. 22D, a portion of the low-concentration fluorescent adhesive layer 174b is removed to form a plurality of second sub-trenches C2" in the first sub-trenches C1". The second sub-trenches C2" respectively form a plurality of second mesa portions P2 in the bonding regions BA. Each of the second mesa portions P2 further includes a second portion 174b2 of the low-concentration fluorescent adhesive layer 174, and the first portion 174b1 of the low-concentration fluorescent adhesive layer 174b and the second portion 174b2 of the low-concentration fluorescent adhesive layer 174b are connected to each other. A trench C" includes a first sub-trench C1" and a second sub-trench C2". In the bonding regions BA, the width of the high-concentration fluorescent adhesive layer 172b1 is $W_H$, the width of the low-concentration fluorescent adhesive layer 174b is $W_L$, the width of the light-emitting units 110e is $W_E$, and the step further satisfies the following inequalities: $W_E<W_L$, $W_H<W_L$, and $0.8<W_H/W_E\leq1.2$.

Figure 22E:
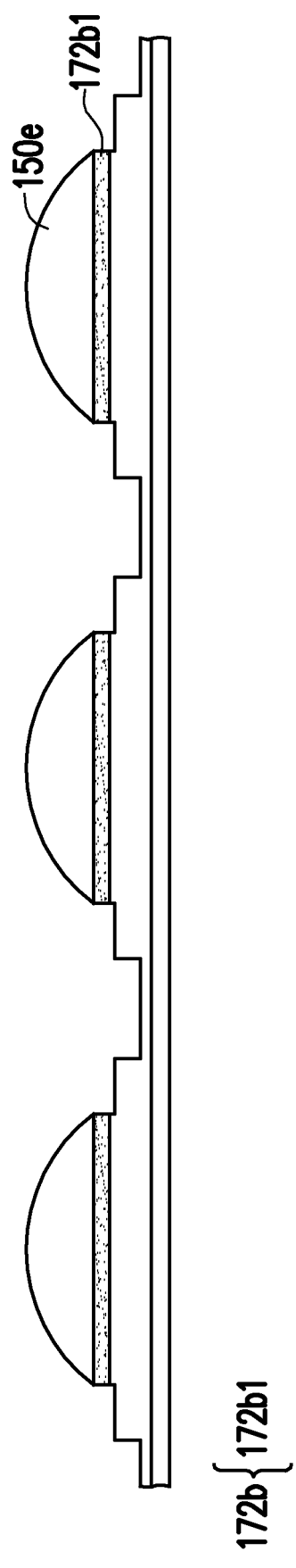

Referring to FIG. 22E, a plurality of translucent adhesive layers 150e is respectively formed on the high-concentration fluorescent adhesive layers 172b in the bonding regions BA. The translucent adhesive layer 150e is, for instance, silicone.

Figure 22F:
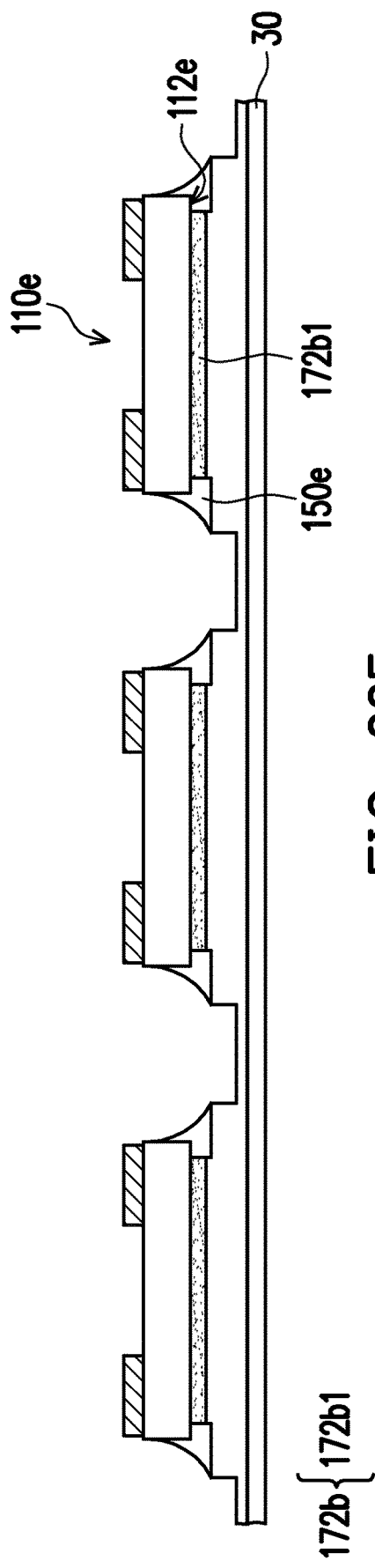

Referring to FIG. 22F, the upper surfaces 112e of the light-emitting units 110e are respectively bonded to the high-concentration fluorescent adhesive layers 172b in the bonding regions BA via the translucent adhesive layers 150e. Due to the capillarity phenomenon, the translucent adhesive layer 150e has a curvature inclined surface, and the thickness of the translucent adhesive layer 150e is greater toward the upper surface 112e of the light-emitting units 110e. Here, the object of the translucent adhesive layer 150e is to fix the position of the light-emitting units 110e.

Figure 22G:
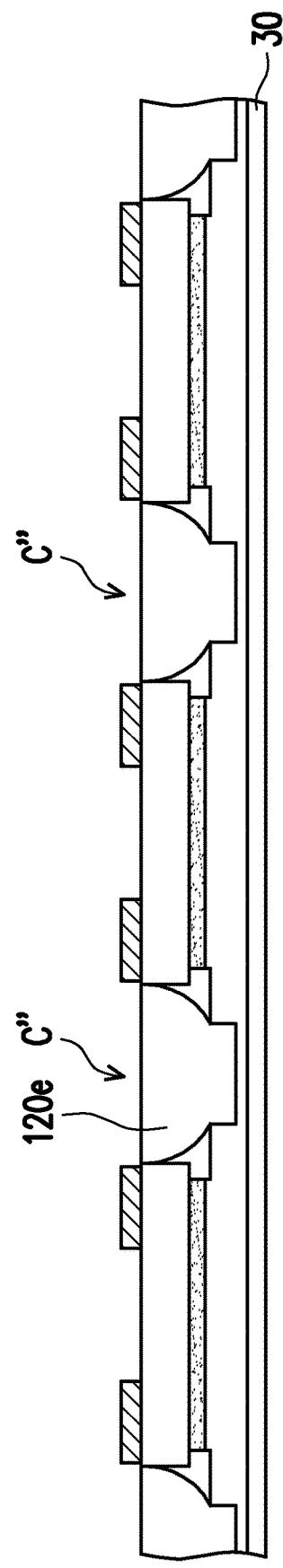

Referring to FIG. 22G, a reflective protecting element 120e is formed on the wavelength conversion adhesive layer 170b and between the light-emitting units 110e to completely fill the trenches C". The reflective protecting element 120e exposes the electrode pads 113 and 115 of the light-emitting units 110e. Here, the reflective protecting element 120e is, for instance, a white adhesive layer.

Referring to FIG. 22H, the reflective protecting element 120e is left to stand such that the reflective protecting element 120e forms a concave surface CS toward the wavelength conversion adhesive layer 170b. Next, the reflective protecting element 120e is cured to fix the shape of the reflective protecting element 120e.

Figure 22J:
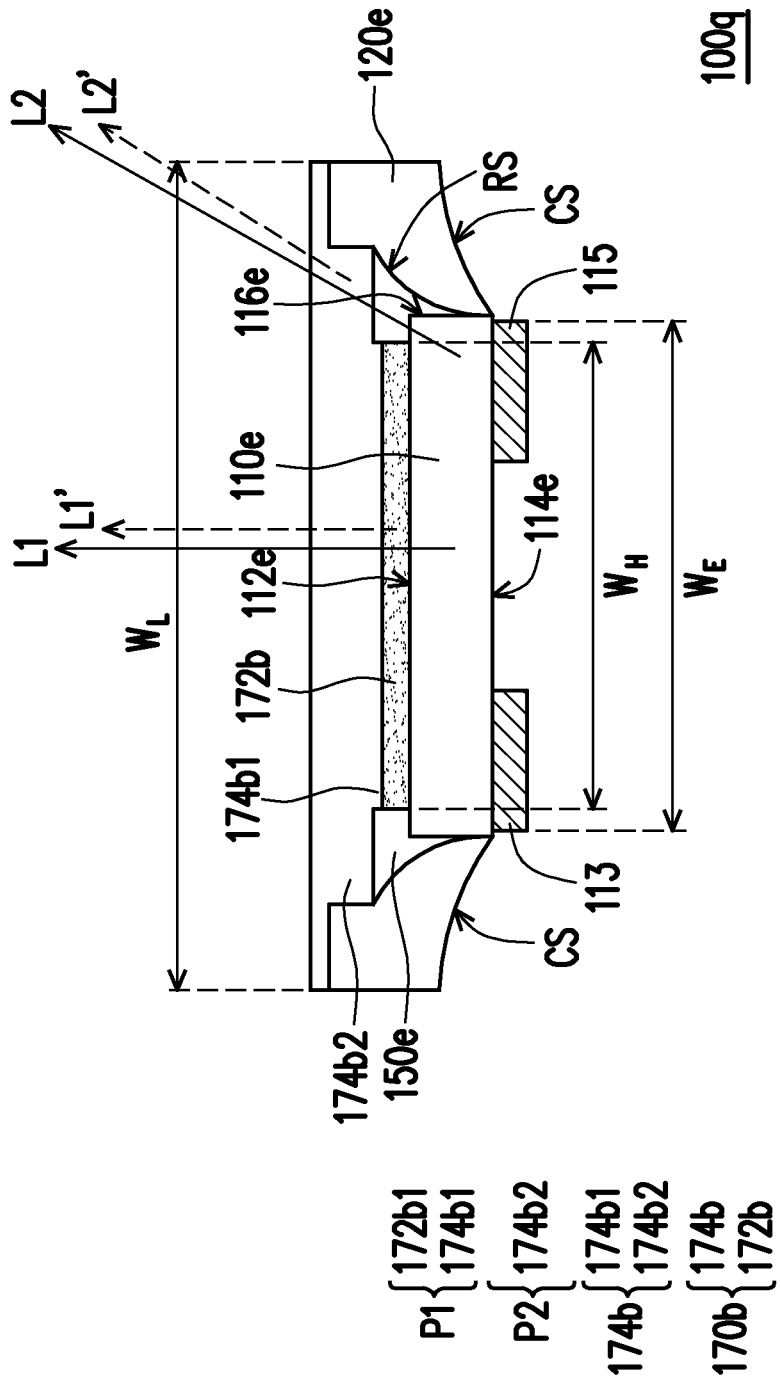

Lastly, referring to both FIG. 22I and FIG. 22J, a cutting process is performed to cut the reflective protecting element 120e and the low-concentration fluorescent adhesive layer 174b along the extending direction of the trenches C" to form a plurality of light-emitting devices 100q separated from one another. Moreover, the first release layer 30 is removed. At this point, the manufacture of the light-emitting devices 100q is complete.

Referring further to FIG. 22J, in terms of structure, the light-emitting device 100q of the present embodiment includes a light-emitting unit 110e, a reflective protecting element 120e, a transparent adhesive layer 150e, and a wavelength conversion adhesive layer 170b. The configuration relationship between each element is described in detail below.

The wavelength conversion adhesive layer 170b is disposed on the upper surface 112e of the light-emitting unit 110e. The wavelength conversion adhesive layer 170b includes a low-concentration fluorescent adhesive layer 174b and a high-concentration fluorescent adhesive layer 172b, and the high-concentration fluorescent adhesive layer 172b is located between the low-concentration fluorescent adhesive layer 174b and the light-emitting unit 110e. More specifically, the wavelength conversion adhesive layer 170b further includes a first mesa portion P1 and a plurality of second mesa portions P2. The second mesa portions P2 are located at two opposite sides of the first mesa portion P1. The first mesa portion P1 includes a first portion 174b1 of the high-concentration fluorescent adhesive layer 172b and the low-concentration fluorescent adhesive layer 174b. The second mesa portion P2 includes a second portion 174b2 of the low-concentration fluorescent adhesive layer 174b. The first portion 174b1 of the low-concentration fluorescent adhesive layer 174b and the second portion 174b2 of the low-concentration fluorescent adhesive layer 174b are connected to each other.

The reflective protecting element 120e covers the light-emitting unit 110e and a portion of the wavelength conversion adhesive layer 170b and at least exposes the two electrode pads 113 and 115 of the light-emitting unit 110e and the low-concentration fluorescent layer 174b. The reflective protecting element 120e has a reflective surface RS, and the reflective surface RS is in contact with the light-emitting unit 110e. More specifically, the reflective surface RS is a curved surface, and the first side of the reflective surface RS is in contact with the light-emitting unit 110e, and the second side of the reflective surface RS is extended toward the wavelength conversion adhesive layer 170b and away from the light-emitting unit 110e. The reflective protecting element 120e has a concave surface CS. The concave surface CS is recessed toward the wavelength conversion adhesive layer 170b and faces the outside. When the light-emitting device 100q of the present embodiment is connected to an external substrate (such as the backplane, printed circuit board, or other types of substrates in a display panel), since the surface of the reflective protecting element 120e exposed to the outside is a concave surface CS, a gap between the light-emitting device 100q and an external substrate caused by a protrusion of the reflective protecting element 120e can be prevented. The generation of the gap causes unsatisfactory bonding between the electrode pads 113 and 115 of the light-emitting unit 110e and the external substrate.

The transparent adhesive layer 150e is disposed on the low-concentration fluorescent adhesive layer 174b and extended to the side surface 116e of the light-emitting unit 110e. The translucent adhesive layer 150e covers the side surface 116e of the light-emitting unit 110e, the high-concentration fluorescent adhesive layer 172b, and a portion of the low-concentration fluorescent adhesive layer 174b.

Referring to FIG. 22J and FIG. 23, in the light-emitting device 100q of the present embodiment, the width of the high-concentration fluorescent adhesive layer 172b is $W_H$, the width of the low-concentration fluorescent adhesive layer 174b is $W_L$, and the width of the light-emitting unit 110e is $W_E$. The light-emitting device 100q further satisfies the following inequalities: $W_E<W_L$, $W_H<W_L$ and $0.8<W_H/W_E\leq1.2$. The light-emitting device 100q of the present embodiment satisfies the inequality design above, and therefore a beam L1 (greater beam intensity) correspondingly emitted by the light-emitting unit 110e adjacent to the optical axis passes through the high-concentration fluorescent adhesive layer 172b and the low-concentration fluorescent adhesive layer 174b adjacent to the optical axis in order, and a beam L2 correspondingly emitted by the light-emitting unit 110e away from the optical axis (weaker beam intensity) passes through the translucent adhesive layer 150e and the low-concentration fluorescent adhesive layer 174b away from the optical axis. Therefore, the light intensity of a conversion beam L1' excited by the beam L1 of the high-concentration fluorescent adhesive layer 172b and the low-concentration fluorescent adhesive layer 174b adjacent to the optical axis is greater than the light intensity of a conversion beam L2' excited by the beam L2 of the low-concentration fluorescent adhesive layer 174b away from the optical axis. The light intensity ratio between the beam L1 and the conversion beam L1' and the light intensity ratio between the beam L2 and the conversion beam L2' are more consistent. As shown in FIG. 23, in comparison to the color light emitted by a known LED structure, the color temperature of the color light emitted by the light-emitting device 100q of the present embodiment at different angles is more consistent.

It should be mentioned that, in the light-emitting device 100q of the present embodiment, the color temperature of the color light emitted by the light-emitting device 100q at different angles can be further adjusted by adjusting variables such as the thickness and width of the high-concentration fluorescent adhesive layer 172b2 and the low-concentration fluorescent adhesive layer 174b in the wavelength conversion adhesive layer 170b at different positions.

Based on the above, in the light-emitting device of an embodiment of the invention, the width of the high-concentration fluorescent adhesive layer is $W_H$, the width of the low-concentration fluorescent adhesive layer is $W_L$, and the width of the light-emitting unit is $W_E$. The light-emitting device further satisfies the following inequalities: $W_E<W_L$, $W_H<W_L$ and $0.8<W_H/W_E \leq 1.2$. By satisfying the inequality design above, the optical path of the beam (greater beam intensity) correspondingly emitted by the light-emitting unit adjacent to the optical axis passes through the fluorescent adhesive layer having a greater concentration in the light-emitting device, and the optical path of the beam (weaker beam intensity) correspondingly emitted by the light-emitting unit away from the optical axis passes through the fluorescent adhesive layer having a smaller concentration in the light-emitting device. Therefore, the color temperature of the color light emitted by the light-emitting device of an embodiment of the invention at different angles is more consistent. Since one of the steps of the manufacturing method of the light-emitting device of an embodiment of the invention satisfies the above inequalities, the color temperature of the color light emitted by the light-emitting device made by the manufacturing method is more consistent at different angles.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A light-emitting device, comprising:
at least one light-emitting unit, wherein the light-emitting unit has an upper surface and a lower surface opposite to each other, the light-emitting unit comprises two electrode pads, and the two electrode pads are located on the lower surface of the light-emitting unit;
a wavelength conversion adhesive layer, disposed on the upper surface of the light-emitting unit, wherein the wavelength conversion adhesive layer comprises a low-concentration fluorescent adhesive layer and a high-concentration fluorescent adhesive layer, and the high-concentration fluorescent adhesive layer is located between the low-concentration fluorescent adhesive layer and the light-emitting unit; and
a reflective protecting element, covering the light-emitting unit and a portion of the wavelength conversion adhesive layer and at least exposing the two electrode pads of the light-emitting unit and the low-concentration fluorescent adhesive layer,
wherein a width of the high-concentration fluorescent adhesive layer is $W_H$, a width of the low-concentration fluorescent adhesive layer is $W_L$, a width of the light-emitting unit is $W_E$, and the light-emitting device further satisfies the following inequality:
$0.8*W_E<W_H<W_E<W_L$.

2. The light-emitting device of claim 1, wherein the wavelength conversion adhesive layer further comprises a first mesa portion and a plurality of second mesa portions, the first mesa portion comprises the high-concentration fluorescent adhesive layer and a first portion of the low-concentration fluorescent adhesive layer, each of the second mesa portions comprises a second portion of the low-concentration fluorescent adhesive layer, and the first portion of the low-concentration fluorescent adhesive layer is connected to the second portion of the low-concentration fluorescent adhesive layer.

3. The light-emitting device of claim 1, wherein the reflective protecting element has a concave bottom surface, and the concave bottom surface is recessed toward the wavelength conversion adhesive layer.

4. The light-emitting device of claim 1, further comprising a translucent adhesive layer, wherein the light-emitting unit further comprises a side surface connected to the upper surface and the lower surface, and the translucent adhesive layer is disposed on the low-concentration fluorescent adhesive layer and extended to the side surface of the light-emitting unit.

5. The light-emitting device of claim 1, wherein the reflective protecting element covers the wavelength conversion adhesive layer and exposes a portion of a side of the wavelength conversion adhesive layer.

6. The light-emitting device of claim 1, wherein the reflective protecting element has a reflective surface, and the reflective surface is in contact with the light-emitting unit.

7. The light-emitting device of claim 6, wherein a first side of the reflective surface is in contact with the light-emitting unit, and a second side of the reflective surface is extended toward the wavelength conversion adhesive layer and away from the light-emitting unit.

8. The light-emitting device of claim 6, wherein the reflective surface is a curved surface.

9. A light-emitting device, comprising:
at least one light-emitting unit, wherein the light-emitting unit has an upper surface and a lower surface opposite to each other, the light-emitting unit comprises two electrode pads, and the two electrode pads are located on the lower surface of the light-emitting unit;
a wavelength conversion adhesive layer, disposed on the upper surface of the light-emitting unit, wherein the wavelength conversion adhesive layer comprises a low-concentration fluorescent adhesive layer and a high-concentration fluorescent adhesive layer, and the high-concentration fluorescent adhesive layer is located between the low-concentration fluorescent adhesive layer and the light-emitting unit;
a reflective protecting element, covering the light-emitting unit and a portion of the wavelength conversion adhesive layer and at least exposing the two electrode pads of the light-emitting unit and the low-concentration fluorescent adhesive layer; and
a translucent adhesive layer, wherein the light-emitting unit further comprises a side surface connected to the upper surface and the lower surface, and the translucent adhesive layer is disposed on the low-concentration fluorescent adhesive layer and extended to the side surface of the light-emitting unit, wherein a width of the high-concentration fluorescent adhesive layer is $W_H$, a width of the low-concentration fluorescent adhesive layer is $W_L$, a width of the light-emitting unit is $W_E$, and the light-emitting device further satisfies the following inequalities:

$W_E < W_L$, $W_H < W_L$; and
$0.8 < W_H/W_E \leq 1.2$.

10. The light-emitting device of claim 9, wherein the wavelength conversion adhesive layer further comprises a first mesa portion and a plurality of second mesa portions, the first mesa portion comprises the high-concentration fluorescent adhesive layer and a first portion of the low-concentration fluorescent adhesive layer, each of the second mesa portions comprises a second portion of the low-concentration fluorescent adhesive layer, and the first portion of the low-concentration fluorescent adhesive layer is connected to the second portion of the low-concentration fluorescent adhesive layer.

11. The light-emitting device of claim 9, wherein the reflective protecting element has a concave bottom surface, and the concave bottom surface is recessed toward the wavelength conversion adhesive layer.

12. The light-emitting device of claim 9, wherein the reflective protecting element covers the wavelength conversion adhesive layer and exposes a portion of a side of the wavelength conversion adhesive layer.

13. The light-emitting device of claim 9, wherein the reflective protecting element has a reflective surface, and the reflective surface is in contact with the light-emitting unit.

14. The light-emitting device of claim 13, wherein a first side of the reflective surface is in contact with the light-emitting unit, and a second side of the reflective surface is extended toward the wavelength conversion adhesive layer and away from the light-emitting unit.

15. The light-emitting device of claim 13, wherein the reflective surface is a curved surface.

16. A light-emitting device, comprising:
at least one light-emitting unit, having an upper surface for light exiting and two electrode pads located on the lower surface thereof;
a wavelength conversion adhesive layer, disposed on the upper surface of the light-emitting unit, and comprising a low-concentration fluorescent adhesive layer and a high-concentration fluorescent adhesive layer located between the low-concentration fluorescent adhesive layer and the light-emitting unit; and
a reflective protecting element, encircling the light-emitting unit and the wavelength conversion adhesive layer, and at least exposing an upper surface of the low-concentration fluorescent layer and the two electrode pads of the light-emitting unit,
wherein the high-concentration fluorescent adhesive layer covers an inner region of the upper surface of the light-emitting unit and exposes a marginal region thereof.

17. The light-emitting device of claim 16, further comprising a translucent adhesive layer filled in a space among the wavelength conversion adhesive layer, the reflective protecting element and the light-emitting unit, wherein translucent adhesive layer covers the marginal region of the upper surface of the light-emitting unit and a portion of a side surface of the light-emitting unit.

18. The light-emitting device of claim 17, wherein the reflective protecting element has a reflective surface in contact with the wavelength conversion adhesive layer, the translucent adhesive layer and the light-emitting unit, wherein the reflective surface comprises a convex surface or a concave surface.

19. The light-emitting device of claim 16, wherein the light-emitting device has a flat lateral surface comprising the reflective protecting element and the low-concentration fluorescent adhesive layer stacked on the reflective protecting element.

20. The light-emitting device of claim 16, wherein the reflective protecting element has a concave bottom surface recessed toward the wavelength conversion adhesive layer.

* * * * *